United States Patent [19]
Capocelli et al.

[11] Patent Number: 5,936,298
[45] Date of Patent: *Aug. 10, 1999

[54] METHOD FOR REALIZING MAGNETIC CIRCUITS IN AN INTEGRATED CIRCUIT

[75] Inventors: Piero Capocelli, Milan; Raffaele Zambrano, San Giovanni La Punta; Federico Pio, Brugherio; Carlo Riva, Renate Brianza, all of Italy

[73] Assignees: SGS-Thomson Microelectronics S.r.L., Agrate Brianza, Italy; Co.Ri.M.Me-Consorzio per la Ricera sulla Microelectronia nel., Catania, Italy

[ * ] Notice: This patent issued on a continued prosecution application filed under 37 CFR 1.53(d), and is subject to the twenty year patent term provisions of 35 U.S.C. 154(a)(2).

[21] Appl. No.: 08/761,185

[22] Filed: Dec. 6, 1996

[30] Foreign Application Priority Data

Dec. 7, 1995 [EP] European Pat. Off. .............. 95830506

[51] Int. Cl.$^6$ .................................................. H01L 29/00
[52] U.S. Cl. ............................................ 257/531; 257/758
[58] Field of Search ...................... 257/758, 531

[56] References Cited

U.S. PATENT DOCUMENTS

| 5,070,317 | 12/1991 | Bhagat | 336/200 |
| 5,095,357 | 3/1992 | Andoh et al. | 257/379 |
| 5,446,311 | 8/1995 | Ewen et al. | 257/531 |
| 5,541,442 | 7/1996 | Keil et al. | 257/531 |

FOREIGN PATENT DOCUMENTS 56-125866  10/1981  Japan .
62-088354   4/1987  Japan .

*Primary Examiner*—Mark V. Prenty
*Attorney, Agent, or Firm*—Allen, Dyer, Doppelt, Milbrath & Gilchrist, P.A.

[57] ABSTRACT

Inductive structures make highly efficient use of the magnetic flux generated, and are consistent with integrated circuit manufacturing techniques. The structures include electrically conductive layers and interconnecting conductor filled vias to define a helical winding surrounding a closed magnetic core. The magnetic core may also be formed by semiconductor manufacturing techinuqes. A method of making the structures on a semiconductor substrate concurrently with the formation of the integrated circuit itself is also disclosed.

21 Claims, 27 Drawing Sheets

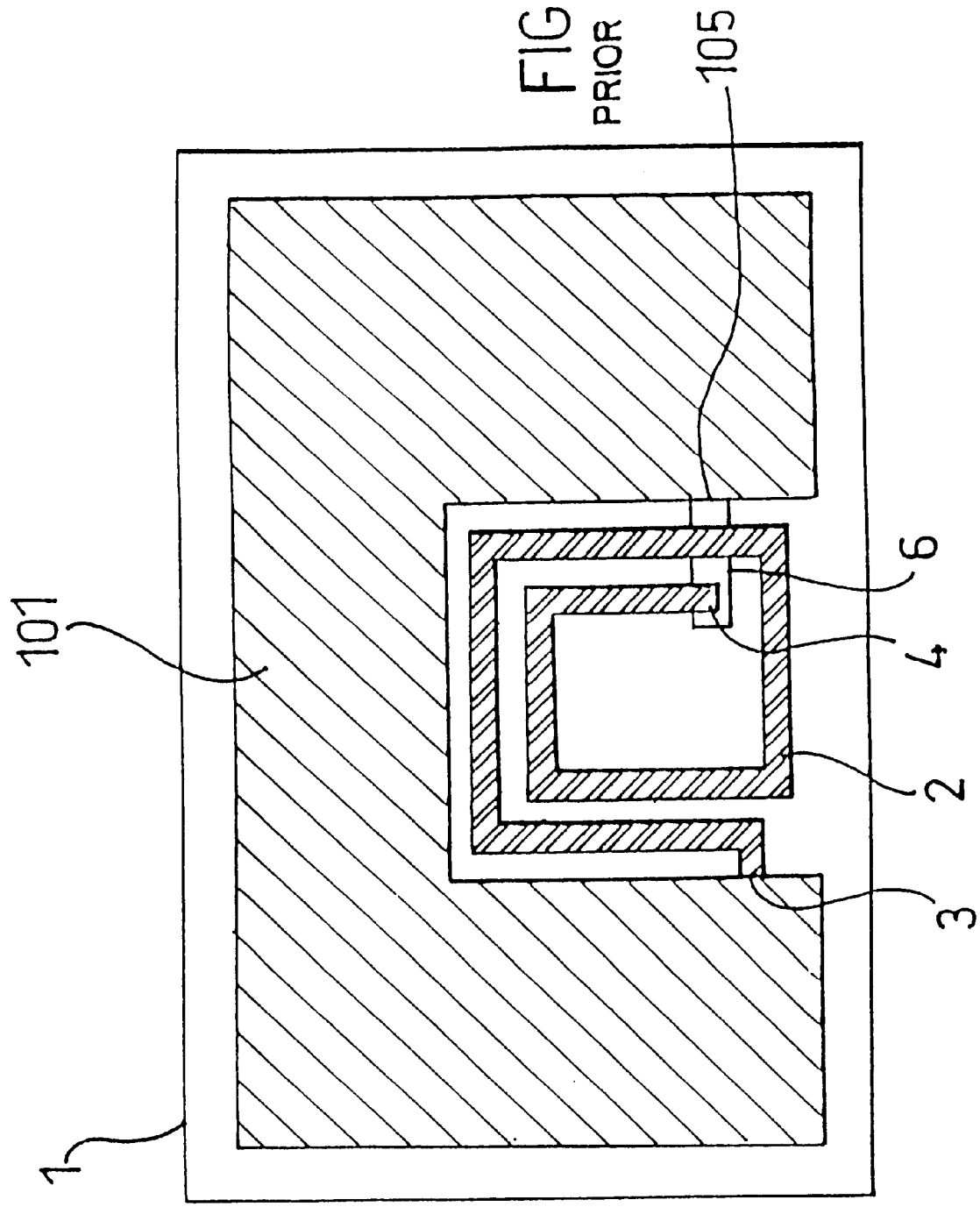

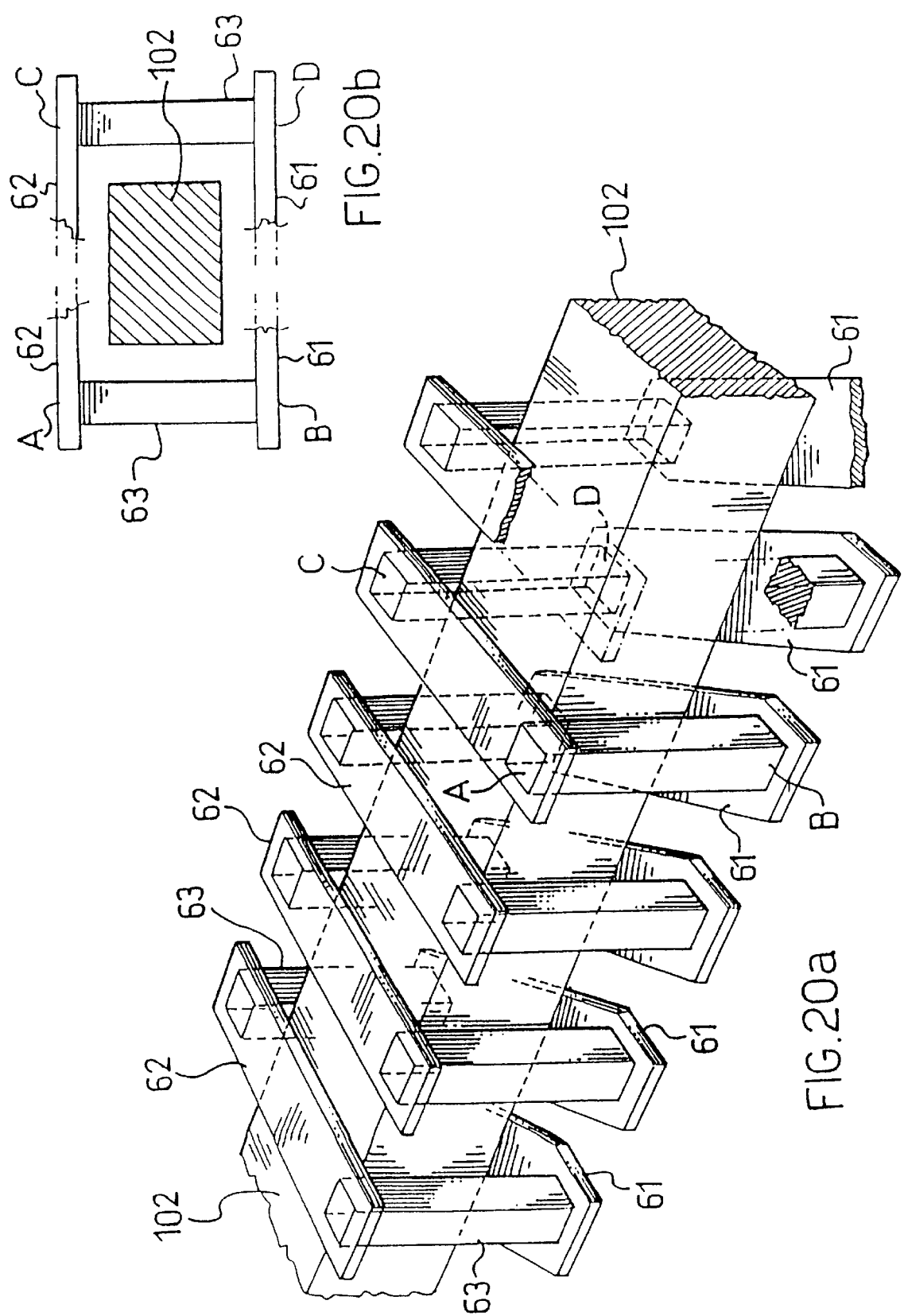

METHOD FOR REALIZING MAGNETIC CIRCUITS IN AN INTEGRATED CIRCUIT

FIELD OF THE INVENTION

This invention relates to magnetic components formed on a semiconductor substrate basically by the same process steps involved in the manufacturing of an integrated circuit.

BACKGROUND OF THE INVENTION

The invention concerns in particular, but not exclusively, electronic devices wherein one or more transistors and one or more passive components are integrated monolithically, and provides for the formation of a magnetic circuit structure concurrently therewith. The description to follow makes reference to this application of the invention for convenience of illustration only.

Passive elements, such as resistors and capacitors, are easily formed along with active components (diodes and transistors) in semiconductor electronic devices. For certain applications, the availability of inductors would be highly desirable. Circuit configurations which haven't been integrated so far because of the unavailability of such components, would then be possible.

Unfortunately, one of the features inherent to a magnetic circuit is the need for large areas or volumes in order to produce acceptable inductance values. The main difficulty lies in the formation of a structure which is three-dimensional in concept within an integrated circuit which is bi-dimensional in nature (all the active structures are located within a few microns from one of the two surfaces).

As is well known, to form a magnetic circuit in a semiconductor component one must integrate on the silicon one or more inductors generating a magnetic field. An adequately exhaustive survey of practicable implementations is contained in U.S. Pat. No. 5,095,357. FIGS. 1, 2, 3, 6, 9, 10, 11, 12, 13, 14 of that document illustrate different solutions to the commonest problems posed by that, i.e. the magnetic circuit is a three-dimensional element in concept, the host integrated circuit is basically a bi-dimensional structure.

A feature shared by all of the solutions proposed in the above-referenced document, but for that shown in FIG. 13, is the generation of a magnetic field perpendicular to the semiconductor substrate. An evident disadvantage of this feature is represented by the induction of the magnetic field in the substrate altering the performance of the active components therein.

It's known from the fundamental laws of physics and electromagnetism that any magnetic circuit produces magnetic induction and an associated electric field. Also known to anyone of ordinary skill in the art of integrated circuits is that the operation of an active component, such as an integrated transistor, is based on the movement of charges of opposite signs through a region of the semiconductor material. Thus, it will be apparent to those skilled in the art that the presence of magnetic fields with lines of force perpendicular and/or parallel to the silicon surface, unless suitably controlled, may cause considerable disturbance and make the operation of the electronic components in the integrated circuit unpredictable. An example of this phenomenon, albeit referred to a magnetic field perpendicular to the substrate, is illustrated in FIG. 2. Another disadvantage of the solutions listed in the reference, and illustrated by FIGS. 1 to 12, comes from the area required to form the coils and from the complexity inherent to providing a number of coupled coils, when transformers are to be formed.

A further disadvantage of such solutions is the capacitive coupling to the substrate of the conductors of which the coils are made. FIG. 13 shows a magnetic component wherein the flux lies parallel to the surface of the semiconductor substrate.

While achieving its objective, not even this solution is entirely devoid of shortcomings. The circuit of FIG. 13, although parallel to the surface of the semiconductor substrate, also generates a magnetic field whose flux lines fan out into the environment and, therefore, into the semiconductor material, at both ends of the winding.

In addition, the inductor winding forming part of the magnetic circuit extends over both faces of the substrate, that is, each element of the coil is passed successively from one face to the other of the substrate by connections which extend through the substrate. It will be appreciated that this is an attempt at bringing the magnetic circuit back to a three-dimensional configuration, while the world of integrated circuits is basically bi-dimensional.

Those skilled in the art will recognize that this technique is very unusual in the manufacturing of integrated circuits, and its adoption would entail substantial modifications to the standard manufacturing methods, including the application of lithographic processes to both surfaces of the semiconductor substrate.

Furthermore, the problem of the magnetic field induced in the substrate remains unsolved, even though this problem is somewhat mitigated by the field lines being parallel to the substrate surface, whereby some of the flux is passed into the air and some into the substrate. Easily seen from the figures are, on the other hand, the complications involved in the manufacturing of structures with multiple coupled windings (FIGS. 13a–e).

Yet another disadvantage associated with the aforementioned prior art is that all the solutions proposed have an open magnetic flux: FIGS. 12 to 15 showing solutions which are of an extreme complexity and less than fully successful in their attempt at producing transformers against such a limitation.

This invention concerns structures of a magnetic device which can be integrated on a semiconductor substrate, consistent with the manufacturing techniques for a standard integrated circuit. These structures provide improved performance over the prior art (including reduced area consumption), prevent magnetic flux losses (that is, ensure better utilization of the magnetic flux generated), and reduce the capacitive coupling to the substrate, while allowing the integration of transformers on a semiconductor substrate concurrently with an integrated circuit. The transformers occupy a limited area and have high magnetic coupling capabilities, thereby overcoming the aforementioned limitations and/or drawbacks of the prior art.

SUMMARY OF THE INVENTION

The technical problem is solved by a semiconductor device having one or more active components and one or more passive components, including a magnetic component, integrated thereon. This invention concerns the integration of inductor and/or transformer structures in integrated circuits having several metallization levels. This invention mainly distinguishes itself from prior art approaches mainly because of the following reasons: 1) the provision of a core which allows a significantly higher inductance per occupied unit area; 2) the suppression of the magnetic field induced in the substrate by providing closed geometries; and 3) the possibility of integrating transformers with multiple windings on one core. The device preferably comprises a semiconductor substrate with a first surface and a second surface opposite to the first; at least one first electric conductor laid on the first surface; at least one first layer of an insulating material at least partially covering the first conductor; at least one layer of a magnetic material over the first insulating material layer; at least a second layer of an insulating material at least partially covering the magnetic material; at least a second conductor overlying the second insulating material layer; and at least first and second vertical conductive connections arranged to connect at least the first electric conductor to at least the second electric conductor, so as to form a first helical structure around the magnetic material which comprises at least the first conductor, at least the second conductor, and at least one of said first and second vertical conductive connections.

The above structure constitutes the elementary coil turn of a magnetic circuit structure having a closed-loop magnetic core around which one or more coil turns are wound. Based on this idea, the technical problem is also solved by a semiconductor device having one or more active components and one or more passive components, including a magnetic component, integrated thereon and characterized in that the magnetic component has a closed magnetic core.

In the last-mentioned case, toroidal inductors could be provided which exhibit no magnetic field losses even in the absence of a magnetic core. In this way, magnetic components can be provided which have a strong magnetic field, a closed core, a low area occupation on the semiconductor material, and are fully consistent with standard integrated circuit manufacturing processes.

More particularly, in accordance with the invention, the formed elementary helical structures can be connected together to provide windings with a desired value of inductance, the magnetic core of each elementary magnetic structure can advantageously be connected to that of the next structure, and extended to form a closed magnetic core in order to avoid losses of the generated magnetic field and thus prevent it from affecting the characteristics of the electronic components integrated on the semiconductor material. In particular, the main steps of forming the magnetic component such as deposition, oxide growing, lithography, and etching, which are widely used in the manufacturing of integrated circuits, can be carried out without difficulties in the processing of the magnetic materials which may include deposition or galvanic processing according to the material of choice. This may take place after the deposition and definition of the first metallic interconnect level, and in processes providing for more than two interconnect levels, only affect the last interconnect level. Those skilled in the art know well how yield rate may be penalized by the contamination introduced by such "foul" process steps as are galvanic depositions in the manufacturing environment of semiconductor device with submicron geometries.

BRIEF DESCRIPTION OF THE DRAWINGS

FIGS. 4 and 5 show in plan view two different embodiments of devices which include a prior art inductor.

FIGS. 20a and 20b are perspective and sectional views, respectively, of a portion of a coil construction according to the invention.

DETAILED DESCRIPTION OF THE PREFERRED EMBODIMENT

Figure 1:
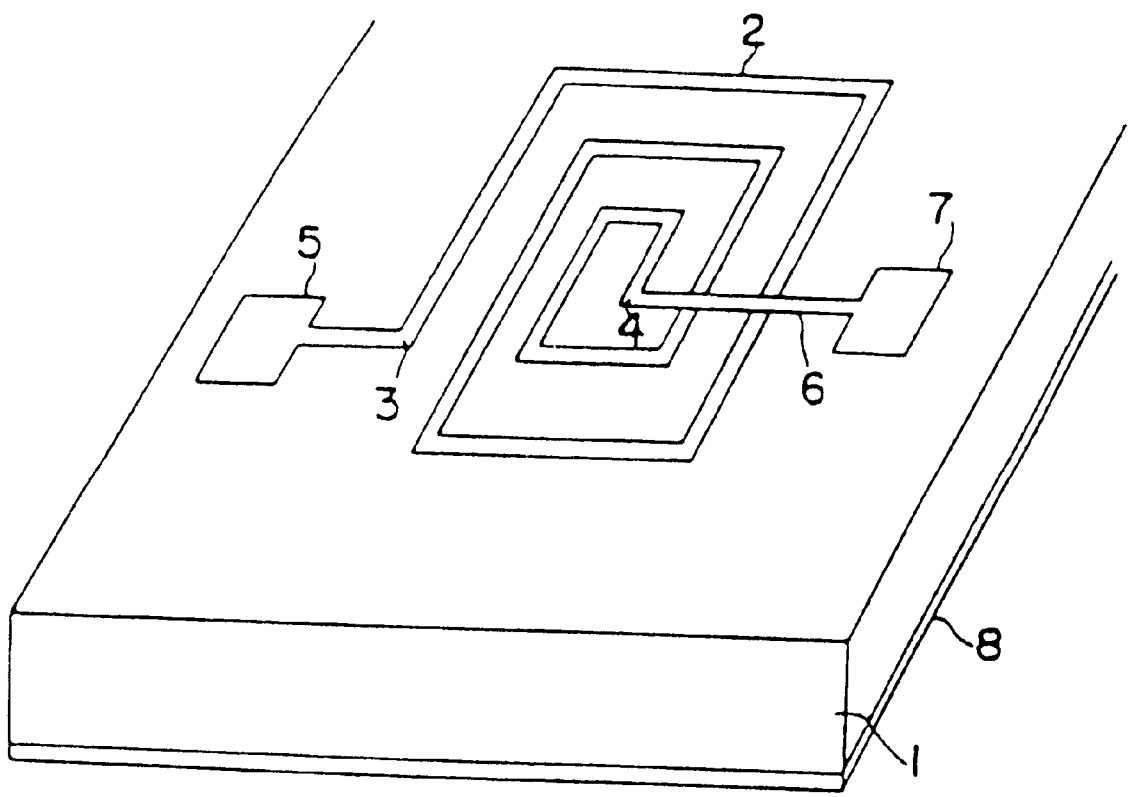
FIG. 1 is a perspective view of a prior art inductor.

Referring to the drawing figures, schematically shown at 100 is a device, embodying this invention, for forming a magnetic component, monolithically integrated on a semiconductor substrate together with other active and passive components. The embodiments of the invention will be discussed herein against the art background highlight the advantages of the invention over the prior art.

In particular, FIG. 1 is a perspective view showing a conventional inductor on a semiconductor substrate 1 which may be gallium arsenide, for example. In this inductor, a coiled conductor 2 is provided on a first surface of the substrate 1. The term "coil" means here a winding whose diameter increases from a center point out, with the conductor length. The coil may have either a round shape laid into a flat spiral of gradually increasing diameter, or a squared one, like those shown in FIG. 1. The coil is built up of metal either by evaporation or deposition, and includes an outer terminal 3 located outside the coil and an inner terminal 4 inside the coil. In FIG. 1, the outer terminal 3 is shown connected to a terminal 5 for convenient connection to other circuit components by wire or other connecting techniques. The inner terminal 4 is taken by a connection 6 to a terminal 7 for external connection-making purposes. The connection 6 goes through the windings of the conductor 2, and accordingly, must be insulated electrically therefrom. A conductive sheet 8 is provided on the opposite face of the substrate 1 from the conductor 2.

Figure 2A:
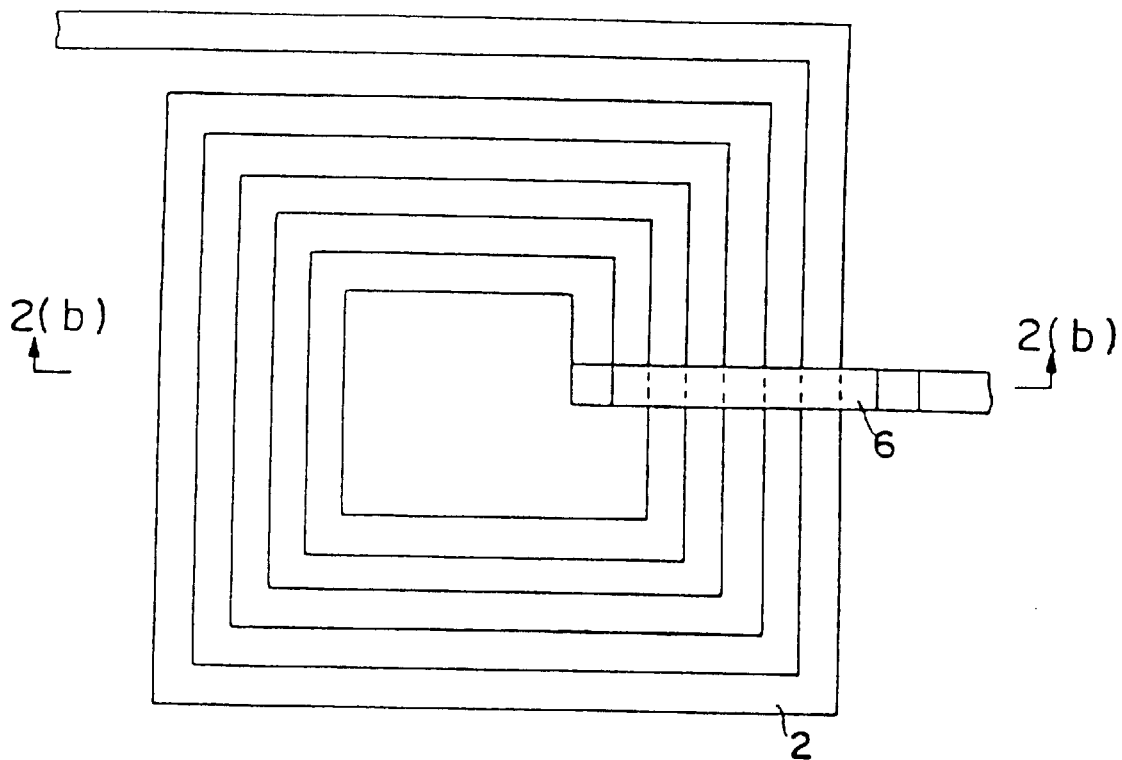
FIGS. 2a and 2b are plan and perspective views, respectively, of a prior art inductor.
Figure 2B:
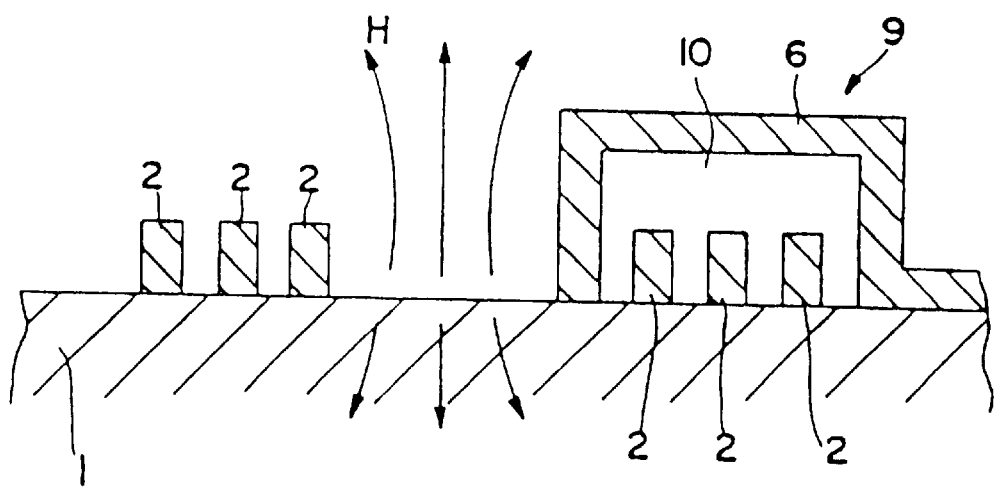

FIGS. 9(a) and 2(b) show a plan view and a sectional view of a prior art inductor which is similar to the inductor of FIG. 1. An air bridge 9 enclosing an empty space 10 is included in the connection 6 to provide electrical isolation from the windings of the conductor 2. The air bridge is formed with a conventional technology, using a temporary support arranged to shield off the windings 2 while the metal for the air bridge 9 is being deposited. Once the metal is deposited, the temporary support is removed, e.g. by means of a solvent, to leave a self-supporting air bridge. Using conventional technologies, the gap between the metal of the air bridge and the conductor 2 can be a few microns at most. With so small a gap, even though the dielectric constant of air between the connection 6 and the turns 2 is relatively low, a significant parasitic capacitance exists at the air bridge 9 between the turns 2 and the connection 6.

Figure 3A:
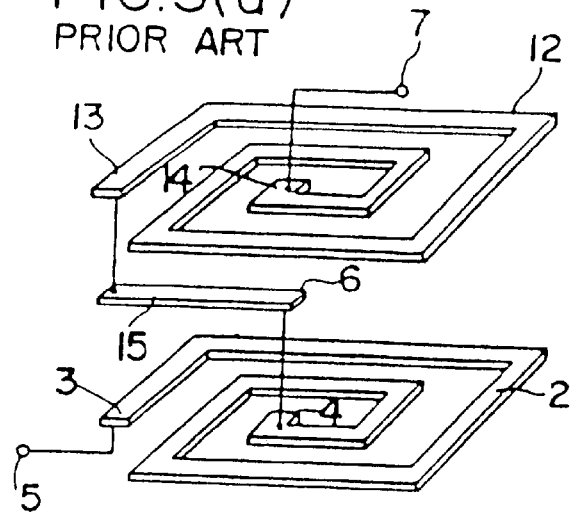
FIGS. 3a, 3b and 3c are perspective, plan, and sectional views, respectively, of a prior art inductor employing two electrically interconnected coils.
Figure 3B:
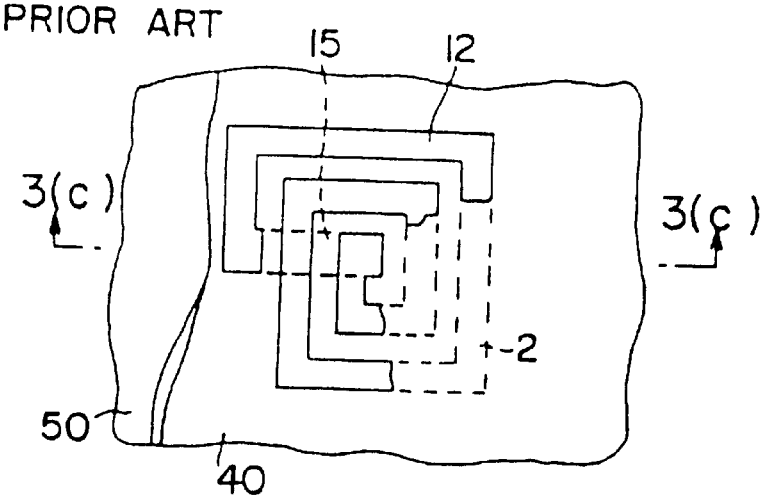
Figure 3C:
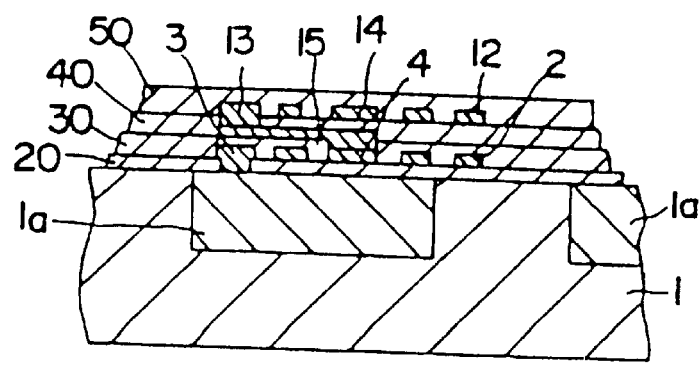

Respectively shown in perspective, plan, and section view in FIGS. 3(a), 3(b) and 3(c) is a further inductive structure. The substrate 1 employed in the structure, which may be made of a semiconductor material, has been omitted from FIG. 3(a) for clarity. The inductive structure of FIGS. 3(a)–(c) comprises two coiled conductors 2 and 12 located on opposite faces. The inner terminal 4 of the coil 2 is connected electrically to an outer terminal 13 of the coil 12 by means of a conductor 15. The inductive structure has a first terminal 5 connected electrically to the outer terminal 3 of the coil 2, and a second terminal 7 connected to the inner terminal 14 of the coil 12.

A construction of the inductive structure depicted schematically in FIG. 3(a) is shown in section in FIG. 3(c). The structure is produced by depositing metal geometries together with insulating layers 20, 30, 40 and 50 laid in succession onto the substrate 1. After depositing the insulating layer 20, a window is cut first to establish the contact with a high-conductivity region 1a in the substrate 1. Thereafter, the coil 2 is formed by depositing a metal and defining its geometry. Then, the insulating layer 30 is deposited and a window is cut to form a connection to the inner terminal 4 of the coil 2. Following a further metal deposition and its patterning to form an interconnection with the conductor 15, the insulating layer 40 is deposited and a window is cut. After yet another metal deposition and the formation of the coil 12, while making an electric connection in the window to the outer terminal 13 of the coil 12, a final insulating layer 50 is deposited.

The inductance of the structure shown in FIGS. 3(a)–(c) is the inductance of the individual coils plus a mutual inductance between the two coils. Since the mutual inductance between the two coils is larger than that to be had with the coils laid side-by-side, the overall inductance is larger than the inductance of two side-by-side coils, and less volume is occupied. However, the manufacturing process for the structure of FIGS. 3(a)–(c) is an extremely complicated one, and, as it happens to the conventional device described with reference to FIGS. 2(a) and 2(b), the spacing of the two coils is constrained by the thickness of the insulating layers 20, 30, 40 and 50. Consequently, in the structure of FIGS. 3(a)–(c), a significantly increased parasitic capacitance will be produced which restricts the useful frequency range.

Figure 6A:
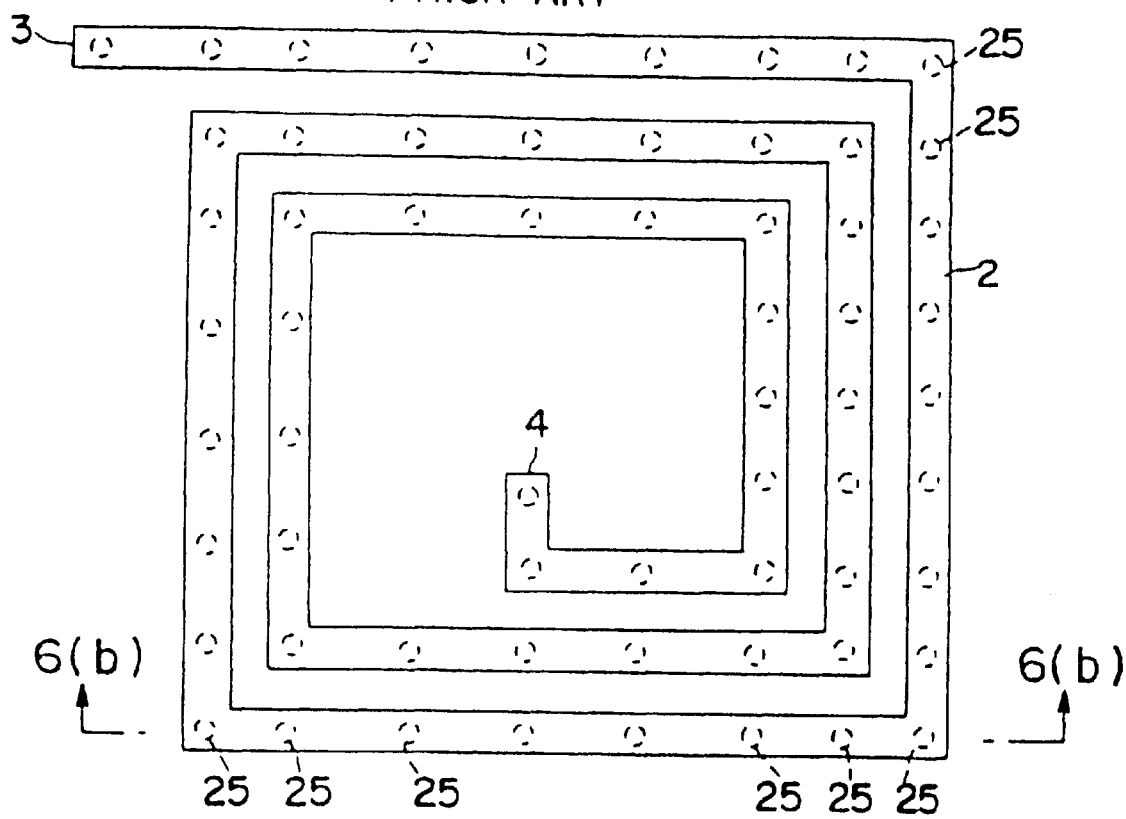
FIGS. 6a and 6b are plan and sectional views, respectively, of a prior art coil inductor.
Figure 6B:
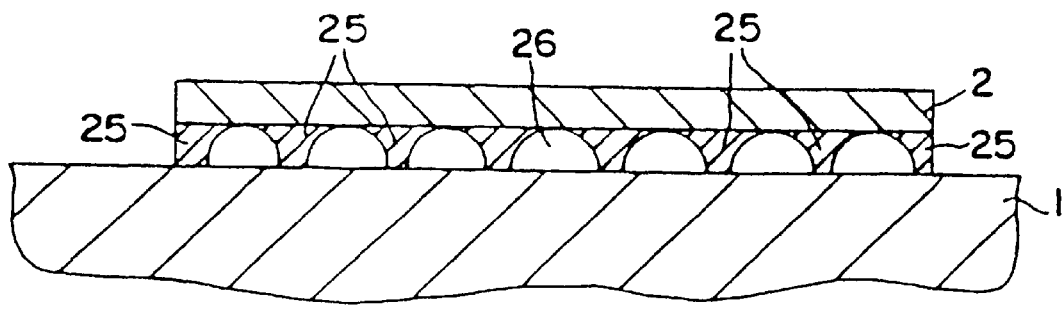

A known method of reducing the parasitic capacitance of a flat coil inductive structure is illustrated in FIGS. 6(a) and 6(b). In these plan and sectional views, a conductive coil 2 is suspended above the surface of a substrate 1 by a set of conductive pins 25. The metal pins 25 are separated from one another by gaps 26. The dielectric constant of air is approximately one, and is smaller than that of the underlying substrate, which may be twelve, for example, when the substrate is gallium arsenide. The supporting structure of FIGS. 6(a) and 6(b) lowers the capacitance between adjacent windings of the coil 2, effectively bringing the dielectric constant between windings from twelve down to one. However, the pins 25 will contribute an amount of parasitic capacitance.

Figure 9:
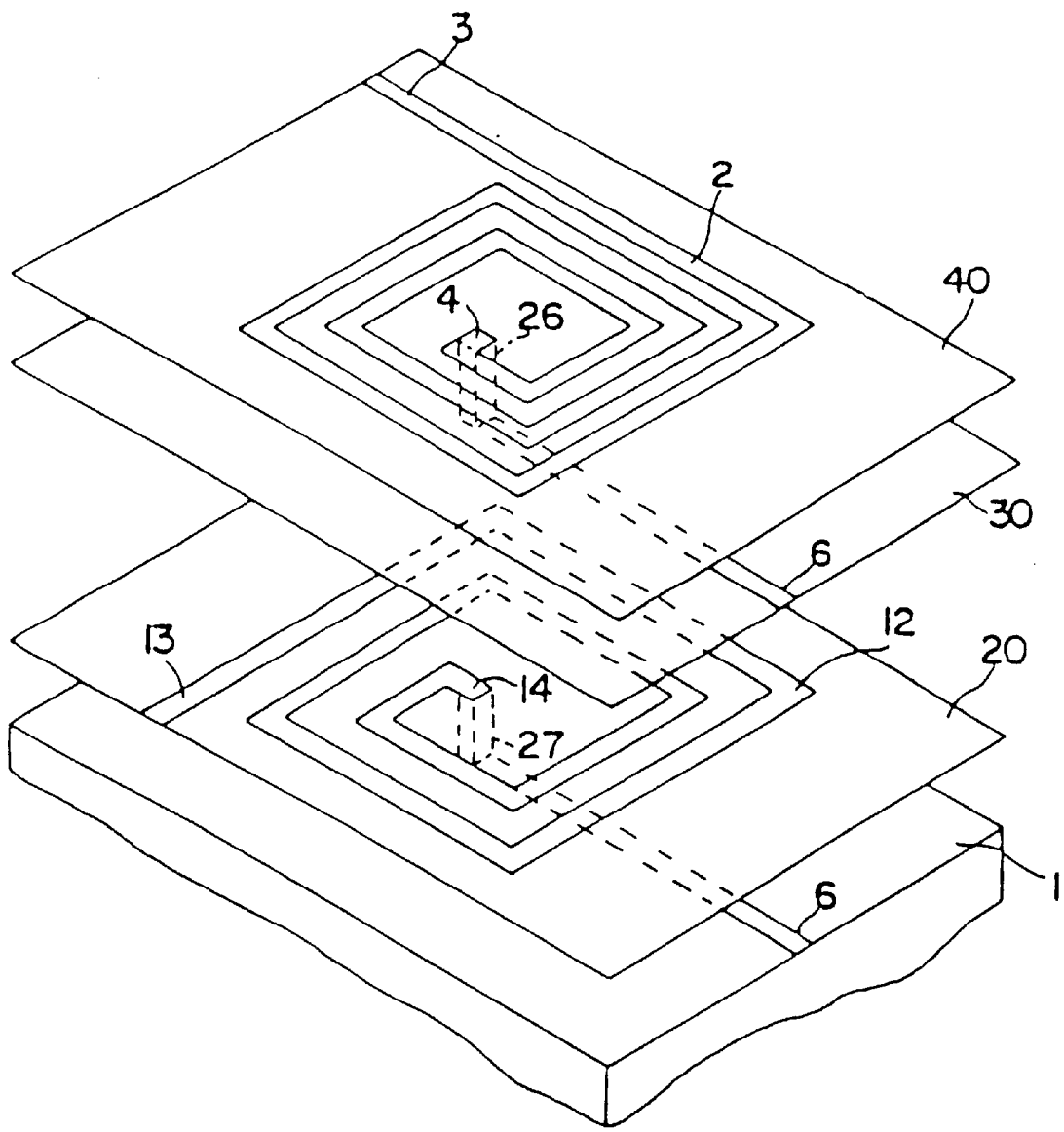
FIG. 9 is a perspective view of a prior art transformer employing two coil inductors laid onto different surfaces separated by an insulating film.

A transformer structure according to the prior art is shown in the exploded view of FIG. 9. This transformer structure comprises an insulating substrate 1 onto which insulating layers 20, 30 and 40 are laid successively. The conducting coils 2 and 12 are laid onto the layers 20 and 40, respectively. Each layer includes a hole passing through the respective insulating layers, through which the conductors 26 and 27 extend respectively to an underlying layer, the layer 30 for the coil 2 and the substrate 1 for the coil 12. These conductors led through the insulating layers provide electric connection to respective contacts 6 from the inner terminals 4 and 14 of the coils 2 and 12. The two coils 2 and 12 are coextensive, i.e. wound in the same direction, and laid one on top of the other in order to maximize their mutual inductive coupling. The mutual inductance of the two coils is governed by their relative geometries and the thickness of the insulating layer. However, the mutual inductance of the coils is limited, because the permeability of the adjacent material is relatively low.

Figure 10A:
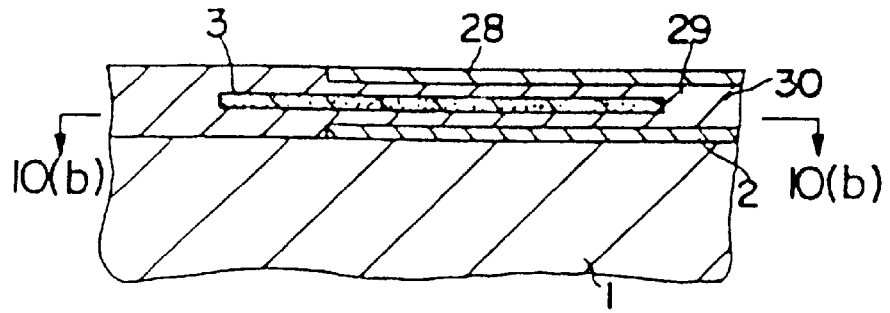
FIGS. 10a, 10b and 10c are one sectional and two plan views, respectively, of a prior art transformer having a magnetic sheet between its coil turns.
Figure 10B:
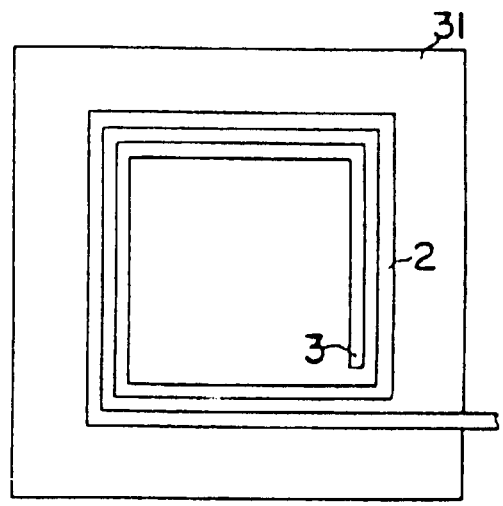
Figure 10C:
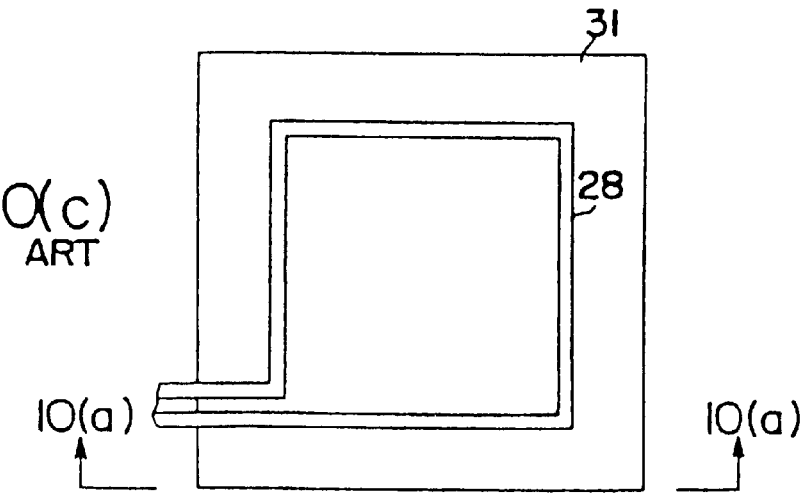

FIGS. 10(a)–(c) show, in section and plan view, another transformer structure intended for semiconductor integrated circuits according to the prior art. This transformer employs a layer of a relatively high permeability material to improve the inductive coupling of two windings. In this conventional structure, a conductive coil is provided on an insulating substrate 1. A second winding 28 comprises a one-turn loop which is separated from the coil 2 by an insulating layer 30. A ferromagnetic layer 31 is encapsulated within the insulating layer 29 between the coil 2 and the winding 28. The ferromagnetic layer 31 being located between the coil 2 and the winding 28, rather than within their central openings, would not be significantly effective to improve the inductive coupling of these two conductors. Thus, a large mutual inductance and a high transformer efficiency are difficult to achieve with such prior art structures.

Figure 11A:
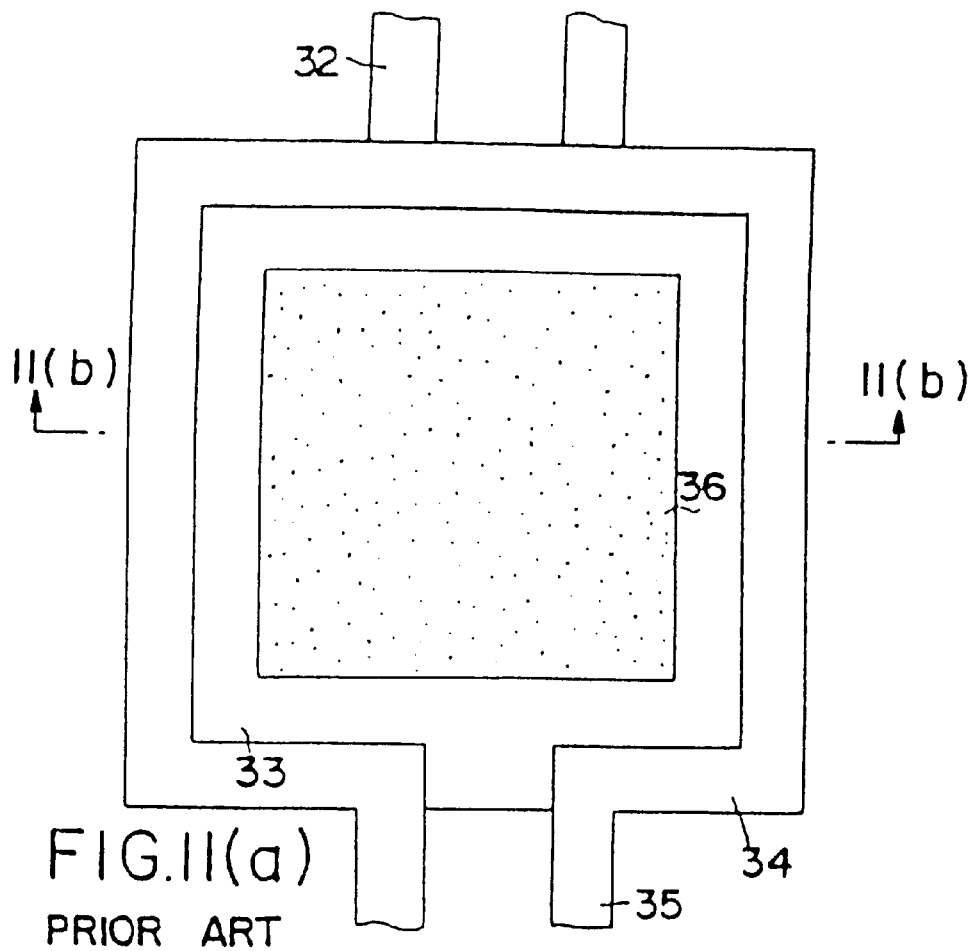
FIGS. 11a, 11b and 11c are plan, sectional, and perspective views, respectively, of a prior art transformer having two windings and a ferrite core laid onto the surface of a gallium arsenide substrate.
Figure 11B:
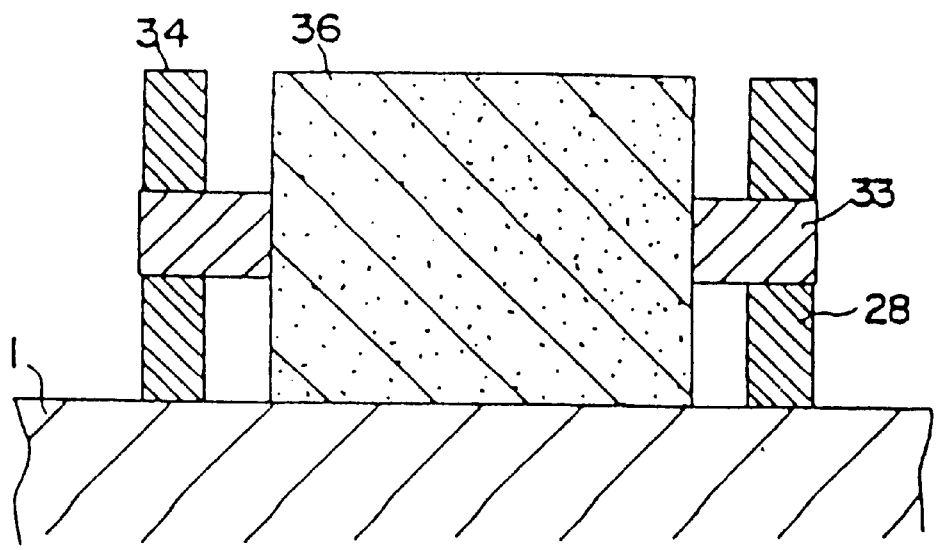
Figure 11C:
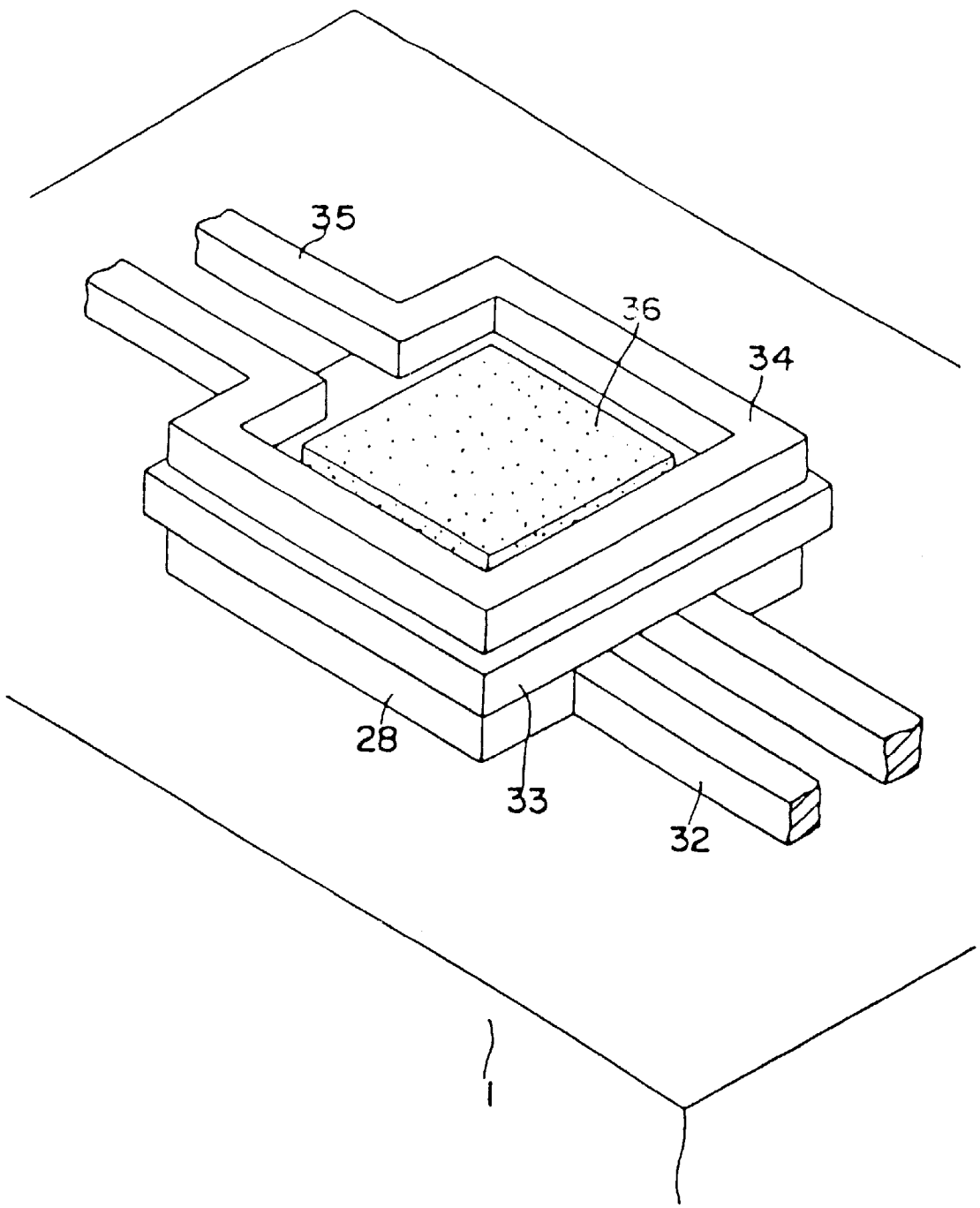

FIGS. 11(a), 11(b) and 11(c) are plan, section, and perspective views, respectively, of an another transformer in a conventional semiconductor integrated circuit. In this structure, a one-turn winding 28 consisting of a thin metal film is provided on the surface of a semiconductor substrate, e.g. of gallium arsenide. The winding 28 has a pair of connections 32. An insulating film 33, e.g. of silicon nitride (SiN) or silicon oxynitride (SiON), is formed onto the winding 28. Another one-turn winding 34 is provided on the insulator 33 directly above and opposite to the winding 28. The windings 28, 34 and the insulating film 33 have common central openings which are generally aligned to each other to form a single core. A ferromagnetic body 36 made of ferrite, for example, is provided within these common central openings to improve the mutual inductance of the windings 28 and 34. The magnetic permeability of the body 36 is significantly higher than that of the substrate 1. Further, by having the magnetic body disposed inside the common core of the two windings 28, 4, a good magnetic coupling can be achieved between the windings. Therefore, this embodiment provides a relatively high mutual inductance, i.e. a highly efficient transformer. As is well known in the art, the permeability of ferrite materials can be in a range upwards of two hundred and fifty, ensuring a very strong coupling between the two windings 28, 34. As shown in FIGS. 11(a) and 11(c), the connections 32 and 35 of the respective windings are preferably aligned along different directions to avoid undesired capacitive coupling therebetween.

The structures of FIGS. 11(a)–(c) may be fabricated in part using conventional semiconductor device techniques, such as by patterning geometries of metals and insulating layers by photolithography, and may form parts of integrated circuits on a substrate which includes interconnected active and passive circuit elements. The ferromagnetic body 36 is formed separately and then fitted into the common central openings of the windings and the insulating film 33.

Alternatively, the ferromagnetic material may be deposited into the common openings of the windings and the insulating layer using deposition techniques, followed by further steps as appropriate to provide the desired ferromagnetic properties. Preferably, the ferromagnetic material is deposited after depositing and patterning the geometries of the windings 28, 34 and their insulating film 33.

Figure 12A:
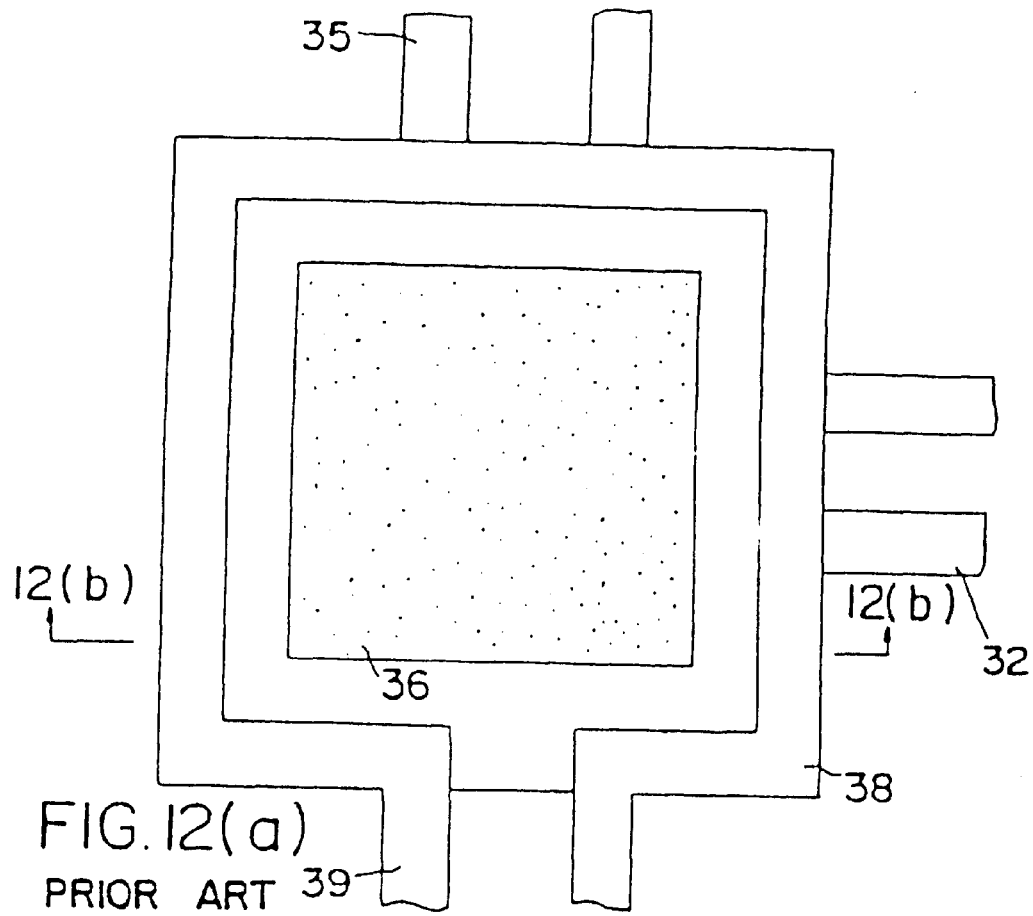
FIGS. 12a, 12b and 12c are plan, sectional, and perspective views, respectively, of a prior art transformer having multiple windings and a ferrite core laid onto the surface of a gallium arsenide substrate.
Figure 12B:
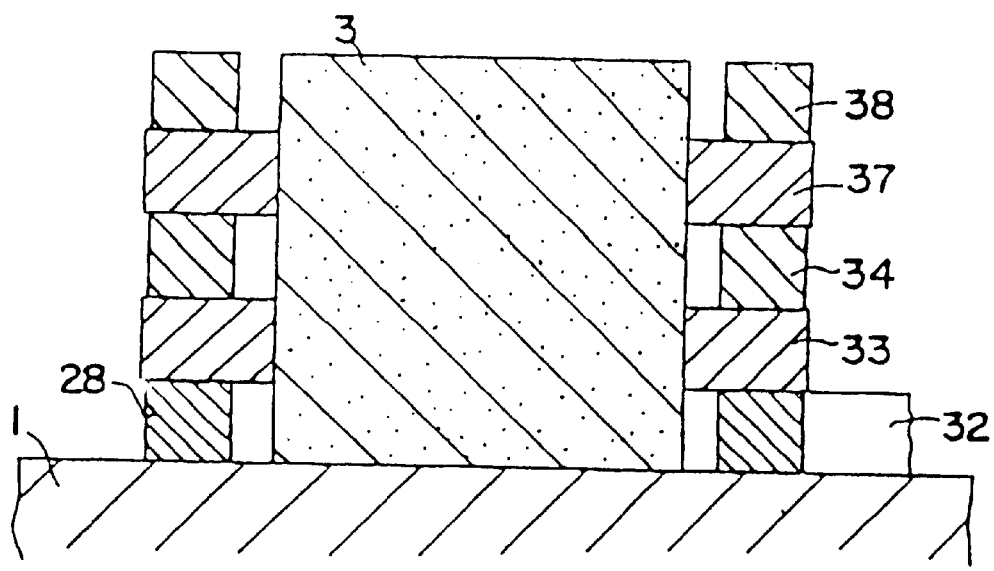
Figure 12C:
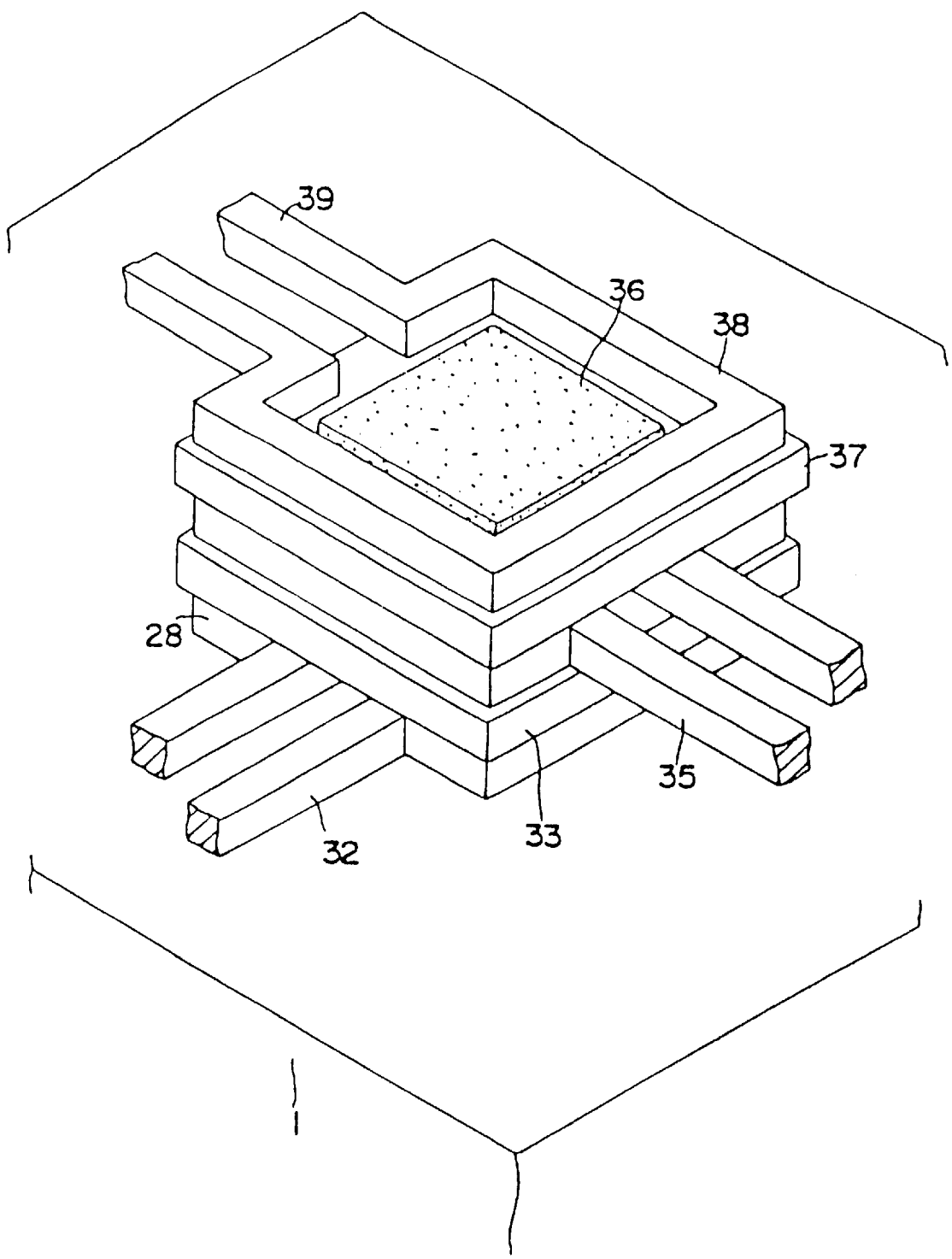

FIGS. 12(a), 12(b) and 12(c) show plan, section, and perspective views, respectively, of an extension of the structure shown in FIGS. 11(a)–(c). The structure of FIGS. 12(a)–(c) is identical with that of FIGS. 11(a)–(c), except that a second insulating film 37 is provided on the winding 34 and a third winding 38 provided on the insulating film 37. This third winding 38 includes the connection 39. The connections of the three windings are routed in different directions. The magnetic body 36 depth is increased to fill the common core of the three windings and the two interposed insulating layers. This stack may be provided with additional windings and insulating layers. This embodiment is produced in the same way as the embodiment of FIGS. 11(a)–(c), except that additional process steps are required to deposit the second insulating layer 37 and the conductor forming the winding 38. The same good mutual coupling is achieved, only that it will take place among three rather than between two conductors.

The technology of monolithic integrated circuits makes transformers with one-turn windings easy to manufacture, but these components have inherently low mutual inductances between their windings. In the prior art construction illustrated by FIGS. 11 and 12 in continuation, the mutual inductance and transformer efficiency of the one-turn windings are significantly improved over the structures of the previous conventional construction of FIG. 10(a), because the ferromagnetic material is closer to the transformer windings.

However, not even this solution is devoid of shortcomings. In fact, it will be apparent that the structure described, while being an improvement over the previous ones, requires process steps not usually employed in a standard integrated circuit manufacturing process. Of these, the heterogeneity from the superimposition of several insulating and metal films compared to the integrated circuit manufacturing process is apparent; a magnetic core is then inserted at the film center as a separately prepared solid body, through a series of steps which make the process definitely non-planar. Also apparent is that, with a perpendicular magnetic flux to the substrate, the resultant structure would fail to meet the requirement for non-disturbance to the adjacent integrated components, being it evident that a substantial portion of the flux generated by the magnetic circuit, whether this happens to be an inductor or a transformer, is injected into the substrate.

This phenomenon is exacerbated by the magnetic circuit described being an open core design, and therefore, susceptible to leakage of the generated magnetic field into the environment, be this the semiconductor substrate or the air.

Another prior art transformer construction is shown in FIGS. 13(a)–(e). This transformer construction comprises a first, generally helical coil 47 surrounded by a second coil 48, also generally helical. The term "helical" means here a three-dimensional winding closely resembling a wire wound around a coil; however, the term also encompasses a winding which has corners in the wire.

Figure 13A:
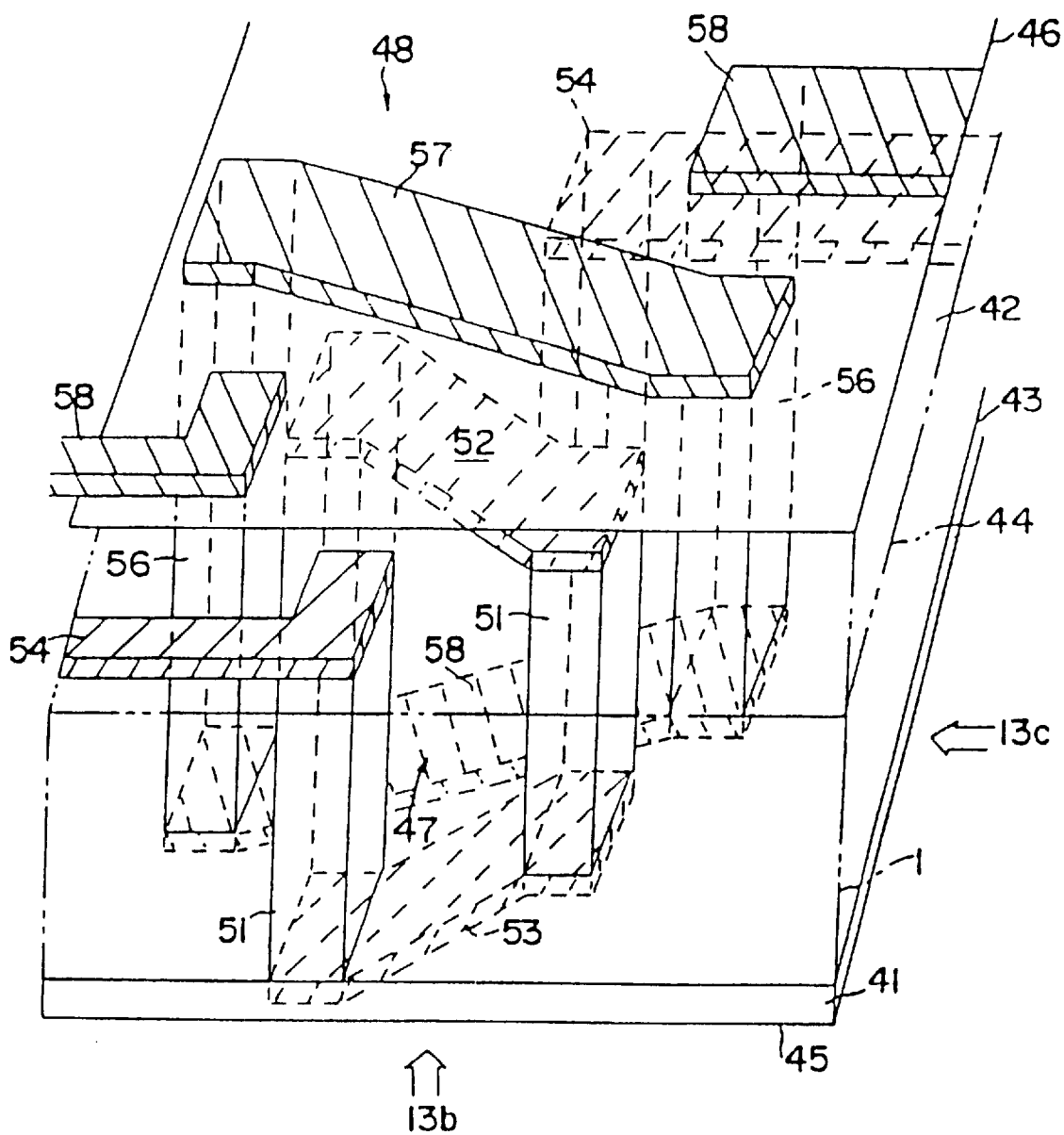
FIGS. 13a to 13e are a perspective view, two side views, a fragmentary view, an exploded view and another fragmentary view, respectively, of a prior art transformer having a helical coil surrounded by another helical coil, both coils being formed of conductors laid on either surfaces of a semiconductor substrate and connected by electrically conductive throughgoing connections.
Figure 13B:
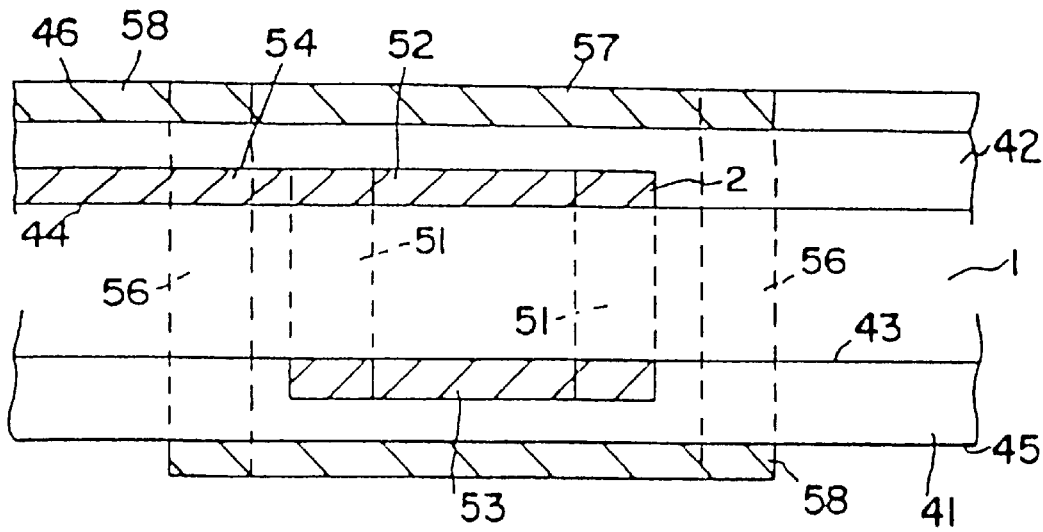
Figure 13C:
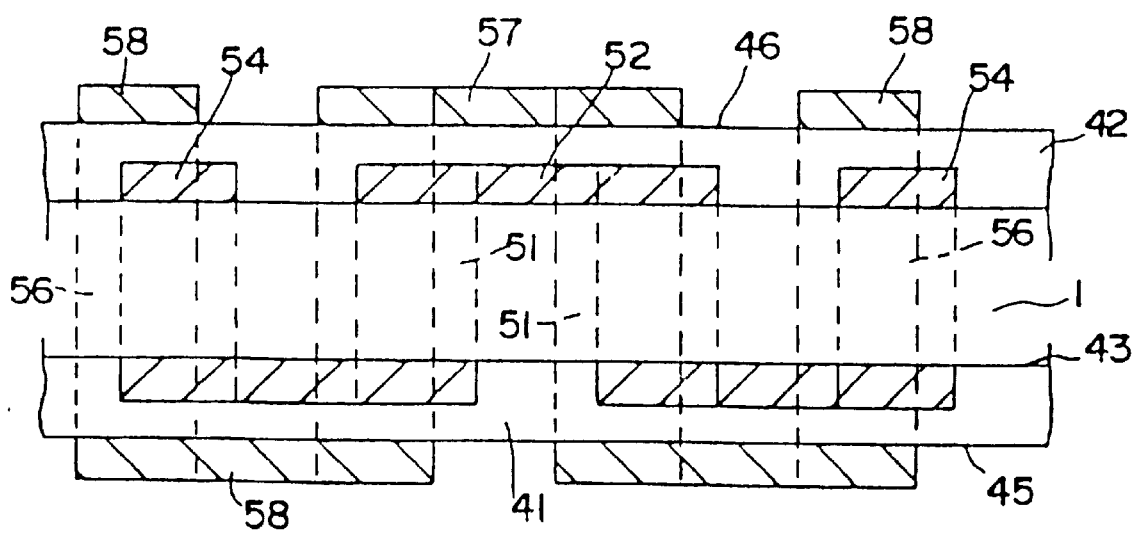

FIG. 13(a) is a perspective view of the above construction, and FIGS. 13(b) and 13(c) are side views of the construction in FIG. 13(a). These views include a large number of imaginary lines and superimposed elements which can be more easily understood by having reference to FIGS. 13(d) and 13(e). Considering FIG. 13(e) first, an insulating substrate 1 comprises a set of holes 51 which penetrate the substrate from a surface 43 to a surface 44 and are filled with a conductive material, such as a metal. The substrate 1 may be a semiconductor, e.g. gallium arsenide or indium phosphide. Pairs of holes are connected electrically to the surface 43 of the substrate 1 by electric conductors 53. Likewise, in the construction shown in FIG. 13(e), an electric conductor 52 provided on the surface 44 of the substrate connects electrically two of the holes on the surface 44. Two of the holes 51 are connected to their respective connections 54 provided on the surface 44. Thus, as FIG. 13(e) brings out, an inductive helical structure is first prepared which closely resembles a wound coil.

Figure 13D:
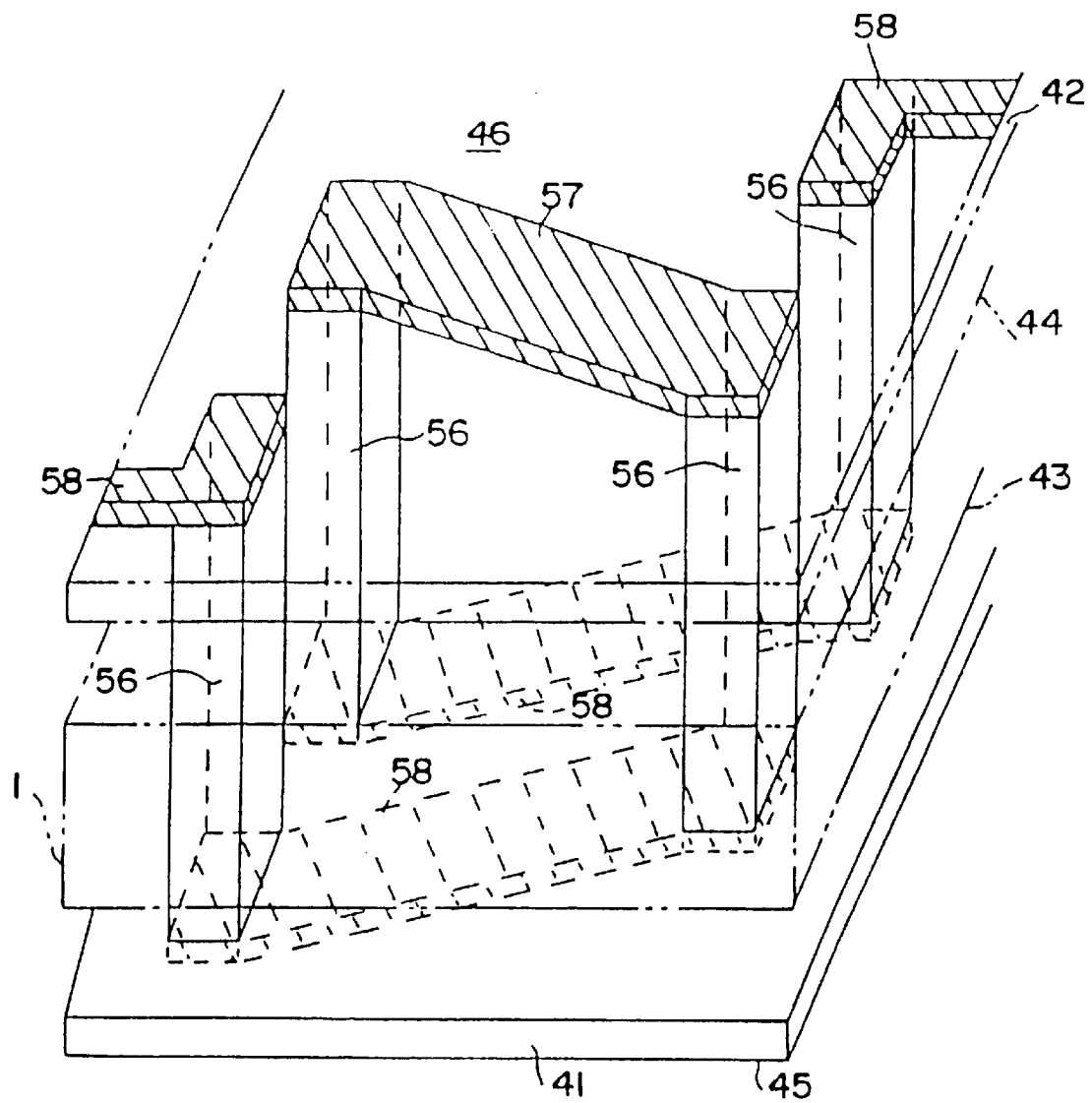
Figure 13E:
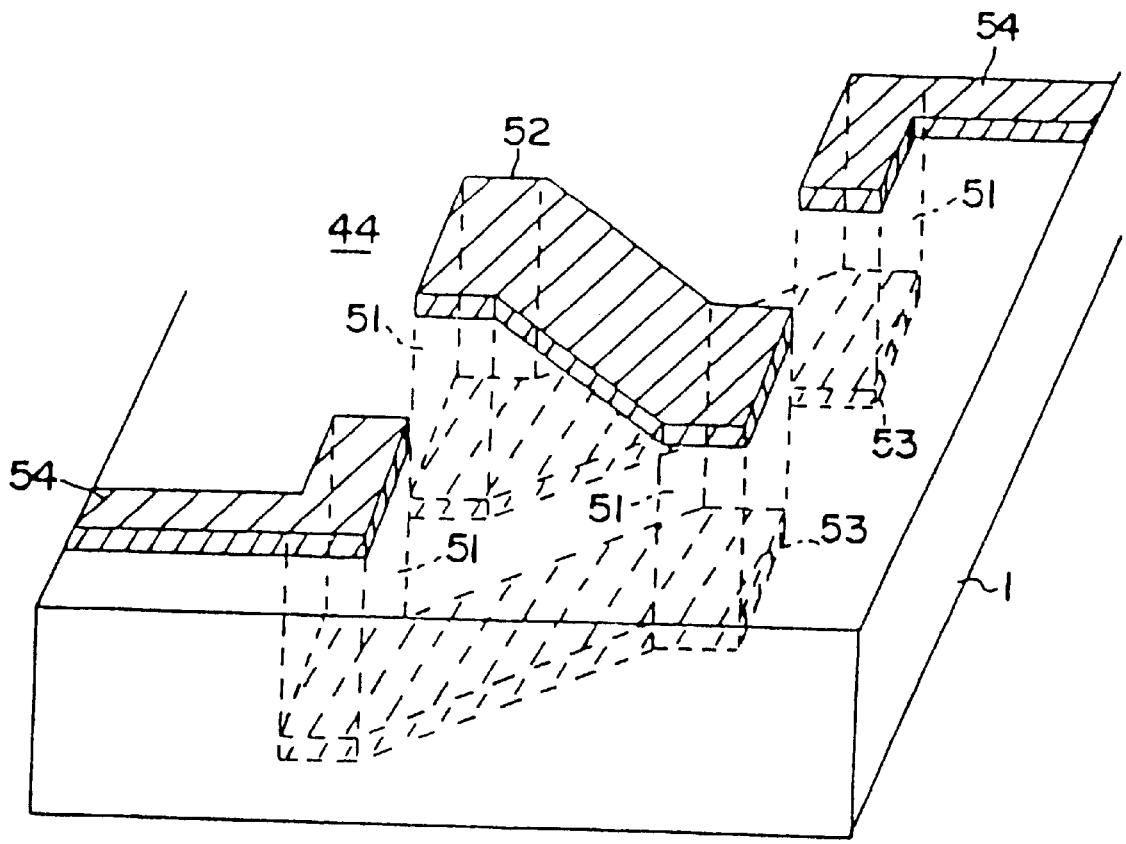

The helical structure 48 that surrounds the helical structure 47 can be more clearly understood by having reference to FIG. 13(d). FIG. 13(d) is an exploded view, and the structure 47 has been omitted therefrom for clarity. After forming the helical structure 47, the insulating layers 41 and 42 are laid onto the surfaces 43 and 44 of the substrate 1. The insulating layers 41 and 42 cover the conductors 53 and 52, respectively. Thereafter, the electrically conducting holes 56 are formed which penetrate the insulating layers 41, 42 and the substrate 1. Pairs of holes exposed on the surface 45 of the insulating layer 41 are interconnected electrically by the conductors 58. A conductor interconnects two of the holes 56 on the surface 46 of the insulating layer 42. The electric connections 58 located on the surface 46 respectively contact one of the holes 56 to provide the external contacts of the structure. On completion of these helices, the structure of FIG. 13(a) is obtained.

The process steps described up to now may seem conventional in the manufacture of integrated circuits, such as the formation of holes and their filling with metal, but actually they are unusual. It is in fact unusual to provide throughgoing holes in the semiconductor substrate and interconnect its two surfaces with metal inserted thereinto, even though this technique may bear some similarity to the formation of holes. Nor is the utilization of both faces of the semiconductor material conventional in the manufacturing of integrated circuits. The technique of lithography applied to both surfaces of the substrate is not current practice in the manufacturing processes of integrated circuits of high-complexity, mainly because of the difficulty of ensuring alignment for submicron geometries located on opposite sides of the substrate.

Coming back to the description of the prior art construction, it can be seen that the helix 48 is laid around the helix 47, which maximizes the inductive coupling between the helices. Also suggested, as in the case of the construction in FIG. 6, is the removal of the insulating films to leave in their place structures resembling air bridges. Here too, we are confronted with process steps that are inconsistent with the manufacturing of integrated circuits.

Figure 14A:
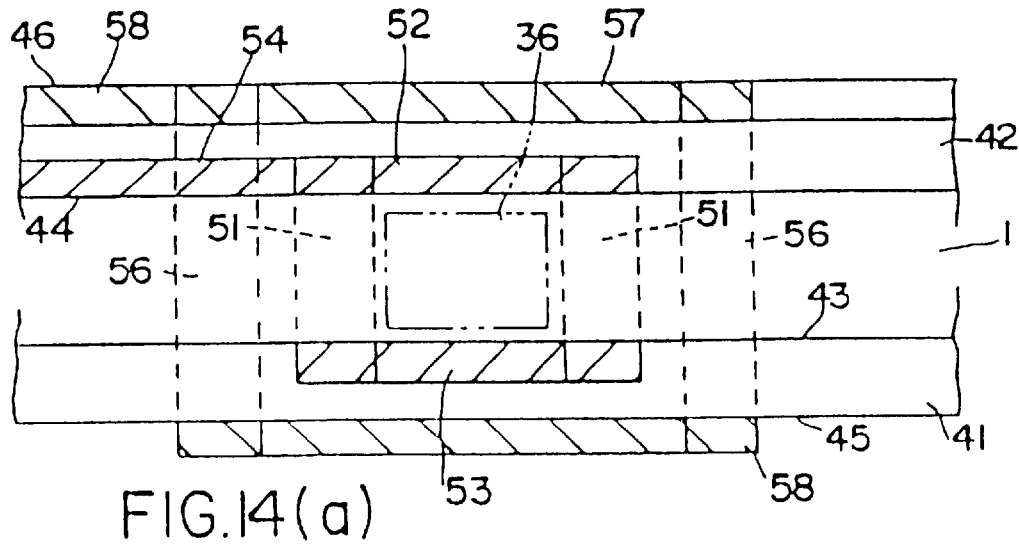
FIGS. 14a and 14b are two side views of a modification of the transformer shown in FIG. 13a, according to the prior art.
Figure 14B:
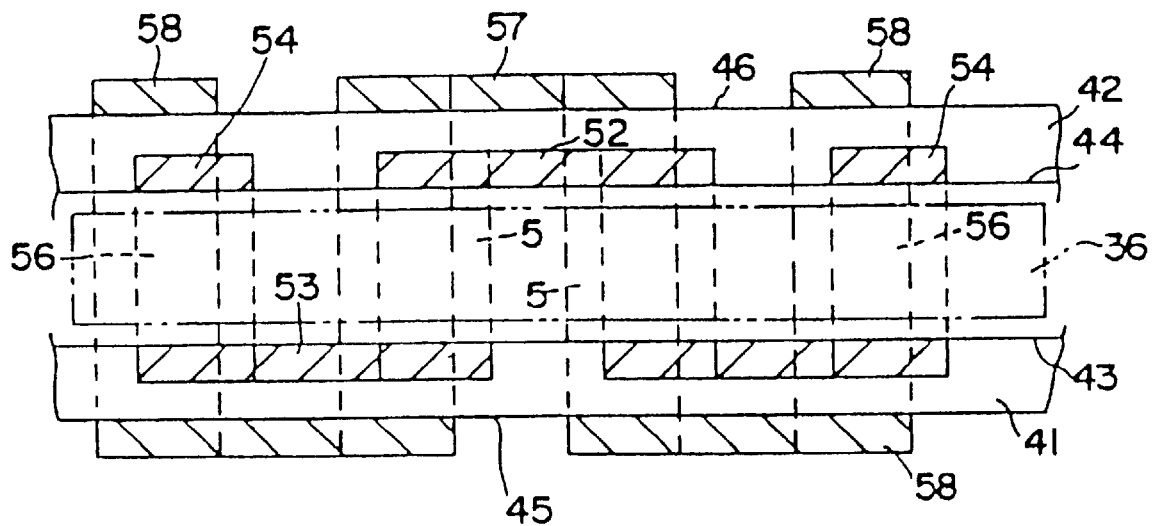

The structure of FIG. 13(a) provides a good mutual coupling between the helix structures, because these can be so close together, but the coupling can be improved by the inclusion of a material having a relatively high magnetic permeability between the two helices. An example of such a transformer is shown in FIGS. 14(a) and 14(b), which are side views similar to those of FIGS. 13(b) and 13(c). Besides the elements shown in FIGS. 13(b) and 13(c), in the embodiment of the invention shown in FIGS. 14(a) and 14(b), a magnetic material 36, such as ferrite, is provided in the substrate 1 inside the helix 47. The magnetic material is a solid body placed into a cavity formed in the substrate 1 before depositing the conductors 52 and 53.

Even the provision of materials, such as ferrite, into pre-arranged cavities in the substrate, as previously mentioned, is an operation normally ruled out in ordinary integrated circuit manufacturing processes. All the arrangements described so far, with particular reference to FIGS. 13 and 14 and in relation to the state of the art, are invariably characterized by the provision of an open core.

As a result, the only way of ensuring coupling between a number of windings has been that of providing coaxial windings which are contained one within the other. This entails, additionally to the use of four metallic interconnect levels, as previously mentioned, processing on both surfaces of the semiconductor substrate.

The inventive idea consists in providing a closed core magnetic device. The coupling between two windings occurs, in the case of transformers, through the material that forms the core. And since the core is a closed one, no losses will occur either into the substrate or the air, as it is well known from the theory of magnetic circuits.

Figure 16:
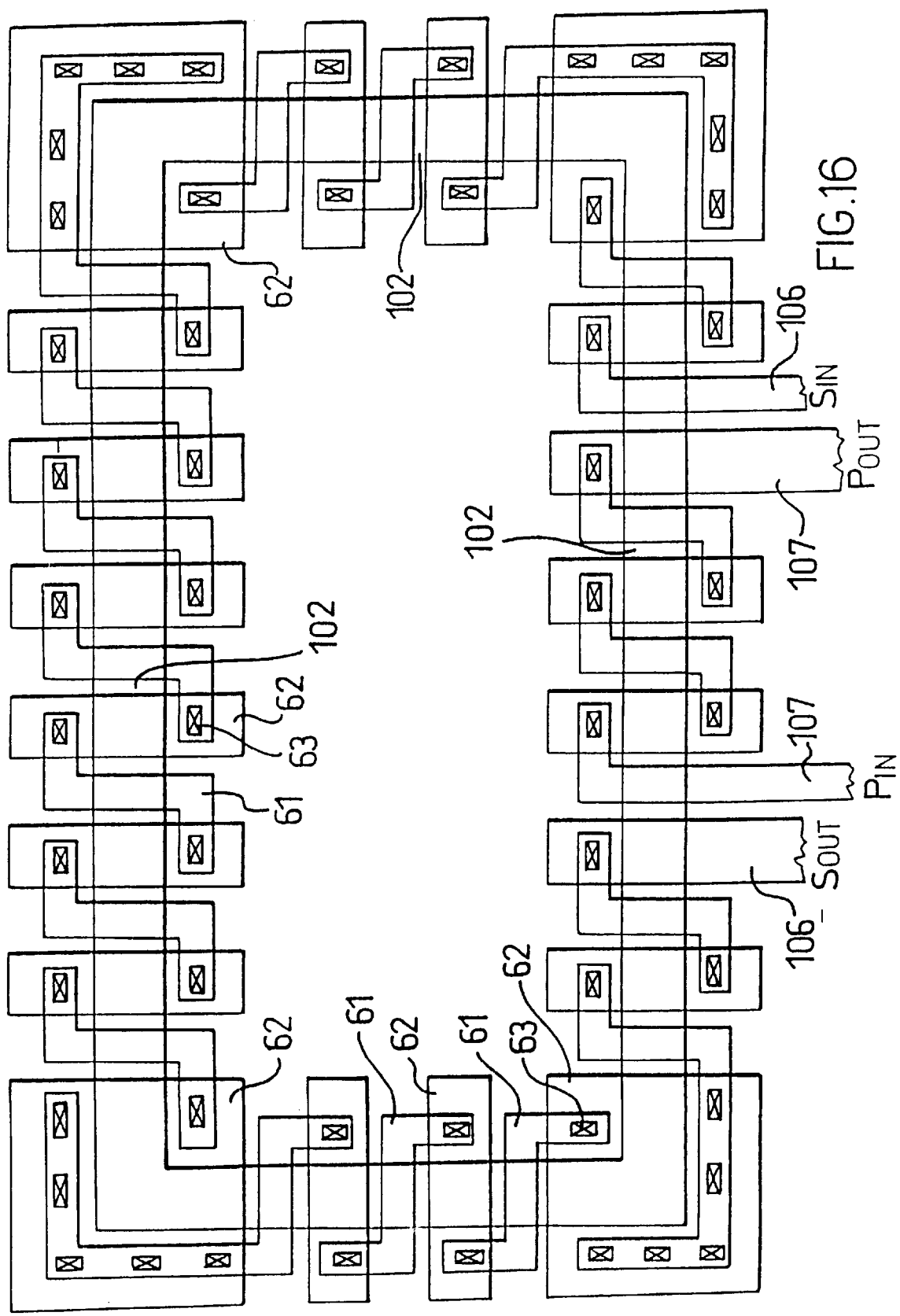
FIG. 16 is a plan view of a transformer according to the invention.

This allows, in the case of transformers, more than one winding to be formed by just laying coil turns beside each other and suitably connecting them as shown in FIG. 16, without increasing the number of the interconnect levels, thereby to provide multiple taps and, hence, a range of output voltages.

The prior art construction of multi-tapped transformers, i.e. transformers with multiple windings, such as the construction shown in FIG. 14, involves the addition of two interconnect levels for each additional winding. In the construction according to the invention, the number of the interconnect levels employed is wholly unrelated to the number of windings.

Figure 4:
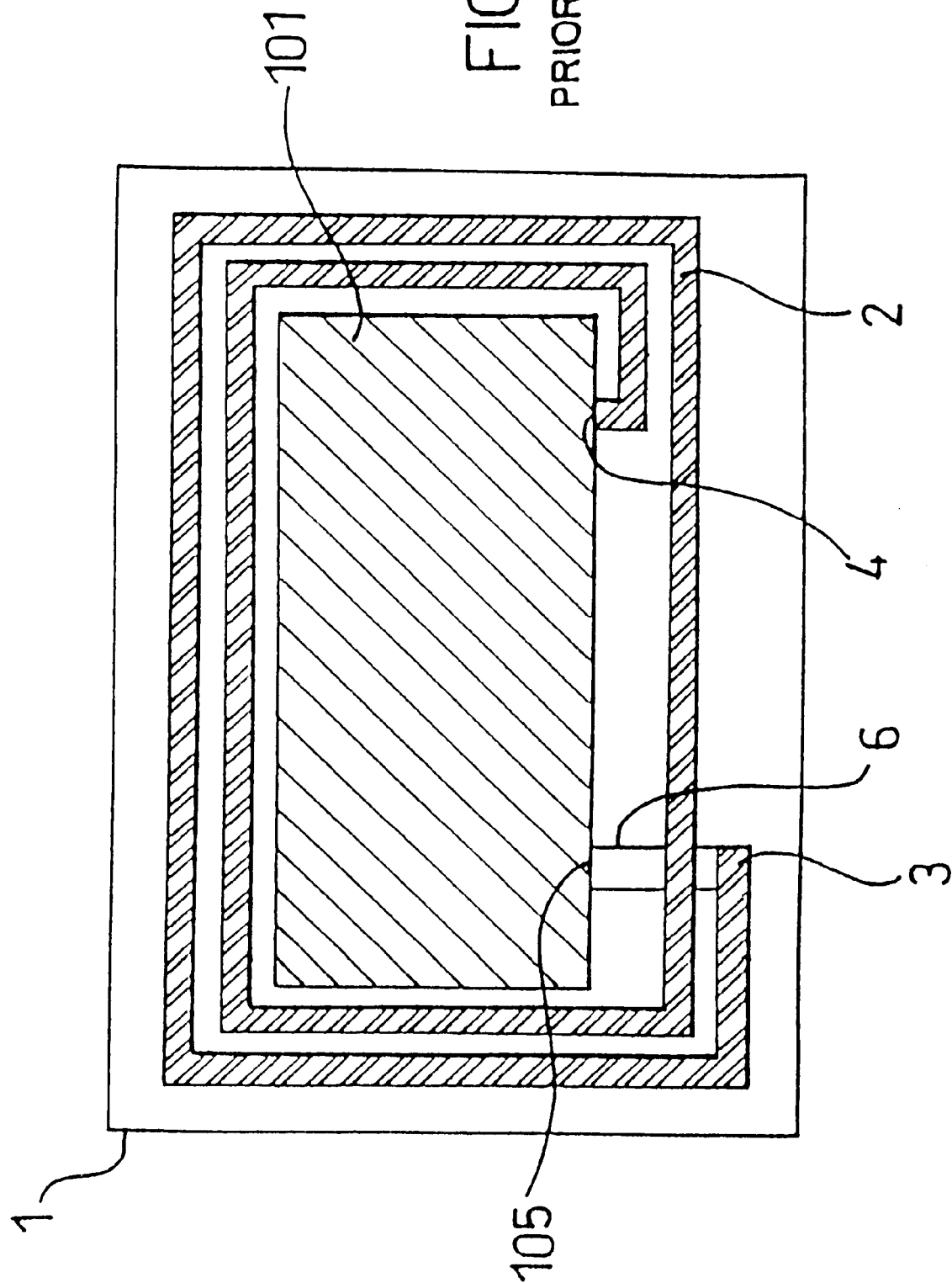

Further embodiments of inductors, exhibiting the problems previously discussed, are described in the following references: 1) JP (A) 61-53760; 2) J. Y. C. Chang, A. A. Abidi and M. Gaitan, "Large Suspended Inductors on Silicon and Their Use in a 2-micron CMOS RF Amplifier", Electron Device Letters, Vol. 14, No. 5, May 1993, pp. 246–248; 3) JP (A) 61-268054; and 4) JP (A) 1-179444. Reference 1) above deals with an inductor formed of a coil positioned along the device edge (FIG. 4), or in a dedicated area (FIG. 5).

Indicated at 1 is the semiconductor substrate whereon the integrated circuit 101 is formed. The magnetic coil is shown at 2; 3 and 4 being its terminals. The connection for taking the terminal 3 of the coil to the terminal 105 of the integrated circuit is designated 6 and 105 is the integrated circuit terminal connected to the coil. The other terminal 105 of the integrated circuit is coincident with 4.

This solution provides low inductance values per unit area and large induced currents in the substrate (the magnetic field is perpendicular to the plane of the coil and, therefore, to the device surface). Furthermore, providing coupled inductors is difficult, and the integration of transformers almost impossible.

Reference 2) above proposes a reduction in the capacitive coupling between the inductor (made by the same technique as described in FIG. 6) and the substrate by a process of selective removal thereof (but for the four corners of the coils). Thus, the inductor will remain suspended above the substrate and only attached to it at the four corners. It is well known to the skilled ones in the art of integrated circuit manufacture that the technique of etching a material from beneath another to leave a volume of air is not commonly employed to fabricate conventional integrated circuits.

Figure 7:
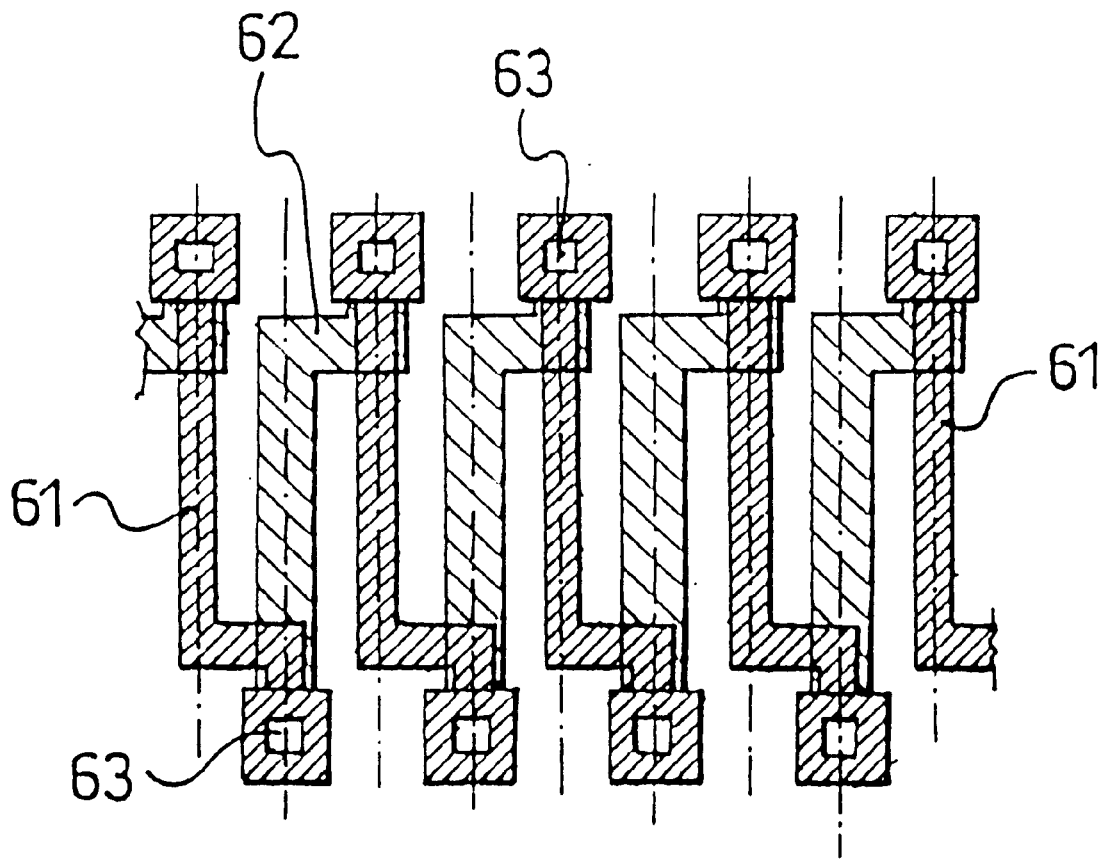
FIGS. 7, 8a and 8b are plan and sectional views of prior art coil turn constructions.
Figure 8A:
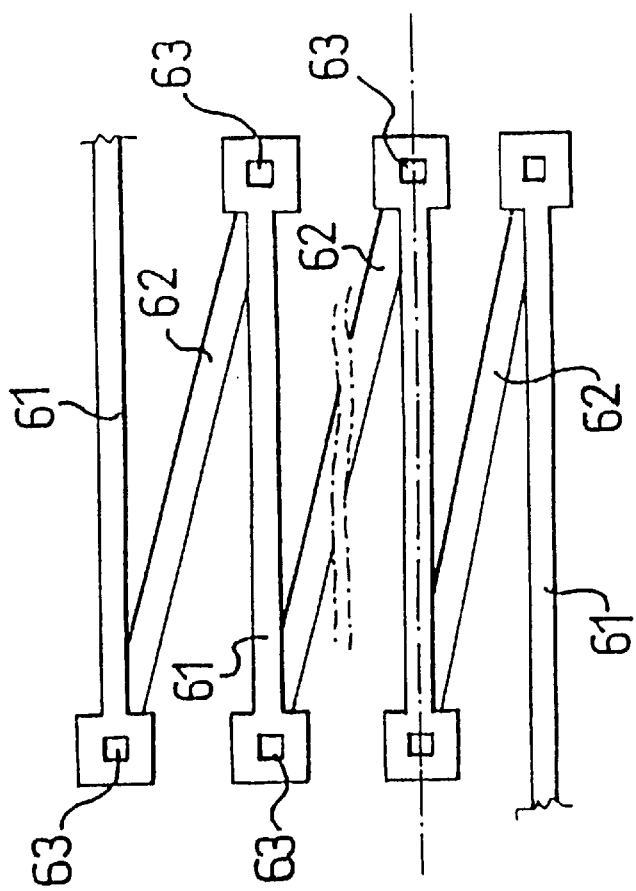
Figure 8B:
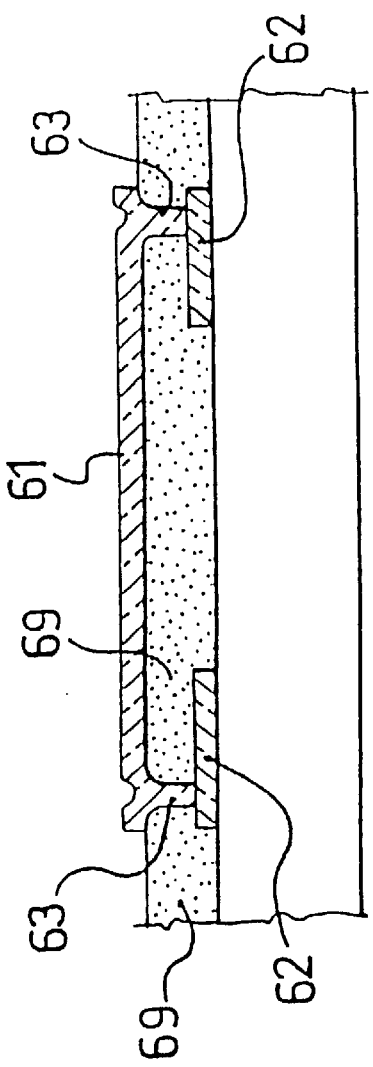

References 3) and 4) above relate to a solenoid whose coil turns are formed by a set of parallel segments from two suitably connected metallization layers. FIGS. 7 and 8 illustrate the constructions respectively described in these two references. Shown at 61 and 62 are two interconnect levels wherefrom the coil is formed, and 63 denotes the interconnection between the two interconnect levels, namely the holes. Denoted by 69 is the dielectric that isolates the two interconnect levels.

The component is parallel to the device surface. At its ends, however, the magnetic field lines close outside the solenoid and induce stray currents in the substrate. This case also has been discussed in connection with FIG. 14.

It should be emphasized that all of these prior art proposals involve open-core inductor constructions, and that no mention is made therein of the possible construction of closed-core coupled inductors and transformers.

Figure 20:
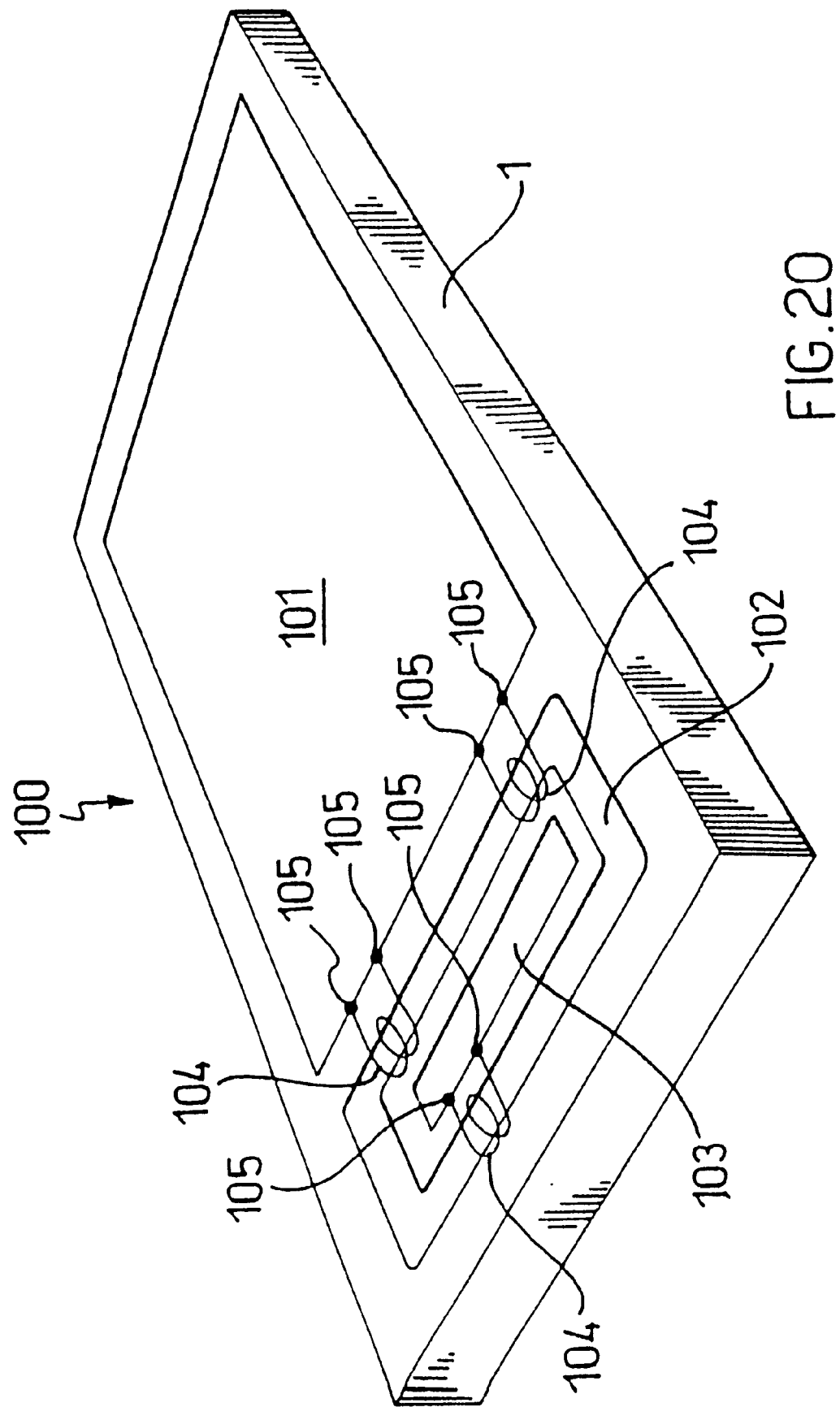
FIG. 20 shows an integrated circuit including a magnetic circuit according to the invention.

Referring to FIG. 20, which shows an embodiment of a magnetic circuit according to the invention, denoted by 1 is the semiconductor substrate, by 101 the portion of the semiconductor substrate where the active and passive components have been formed using standard integrated circuit manufacturing techniques, and by 104 the windings which comprise the magnetic circuit wound around a core 102. A further portion of the substrate is denoted by 103 where passive and active components have been formed, again by standard integrated circuit manufacturing techniques, these components can be utilized to provide an oscillator if suitably connected by a coil 104. The closed core 102 ensures the coupling between the windings 104.

Figure 15:
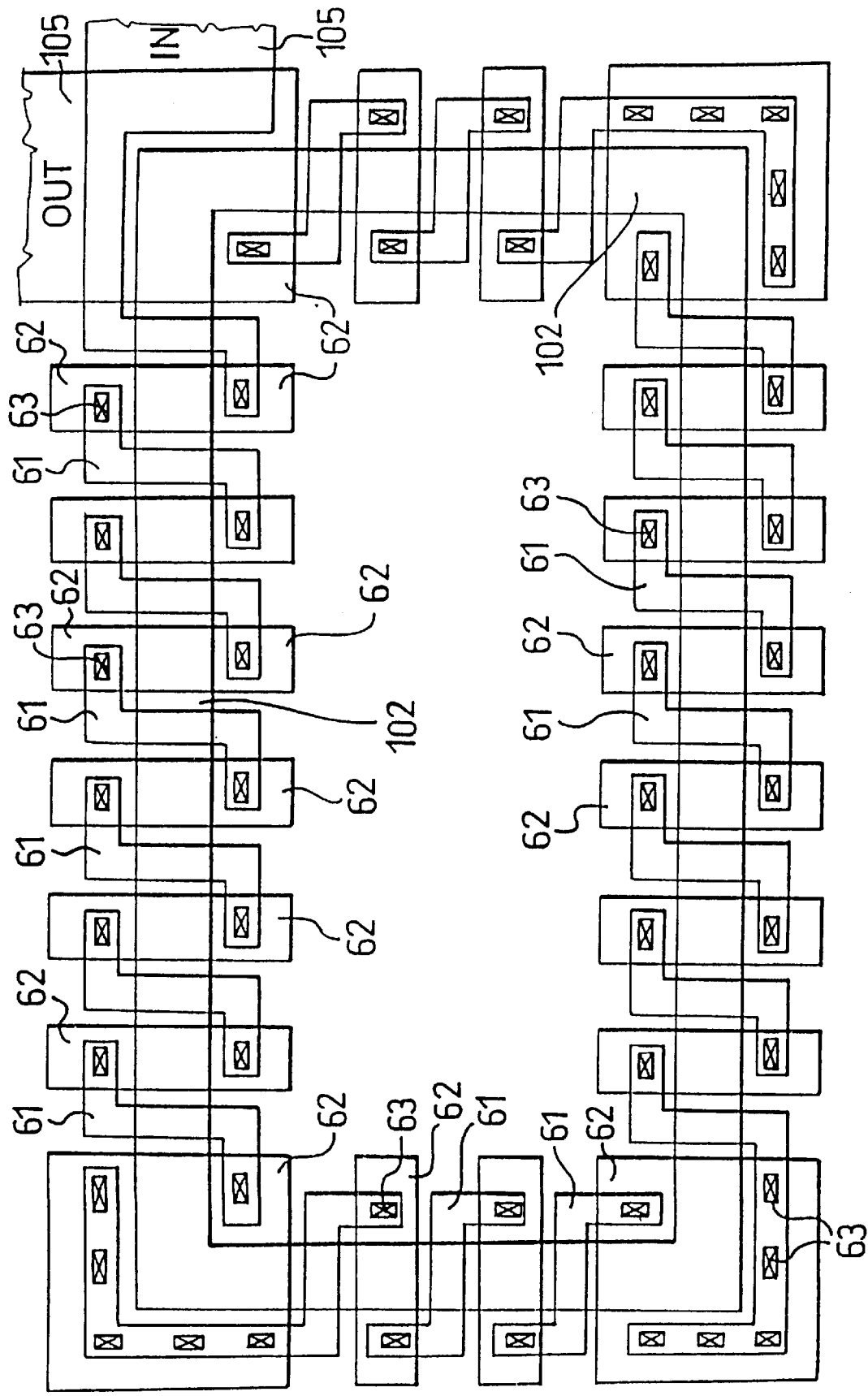
FIG. 15 is a plan view of an inductor according to the invention.

FIG. 15 illustrates a particular layout for an inductor embodying this invention. Here again, 61 and 62 denote the two interconnect levels used to form the elementary coil turn, and 63 denotes the conducting connection between the two interconnect levels. Also, shown at 102 is the magnetic core which allows coupling of the two windings in accordance with the invention. Further, shown at 105 are the terminals of the integrated circuit to which the inductor is connected.

Figure 17:
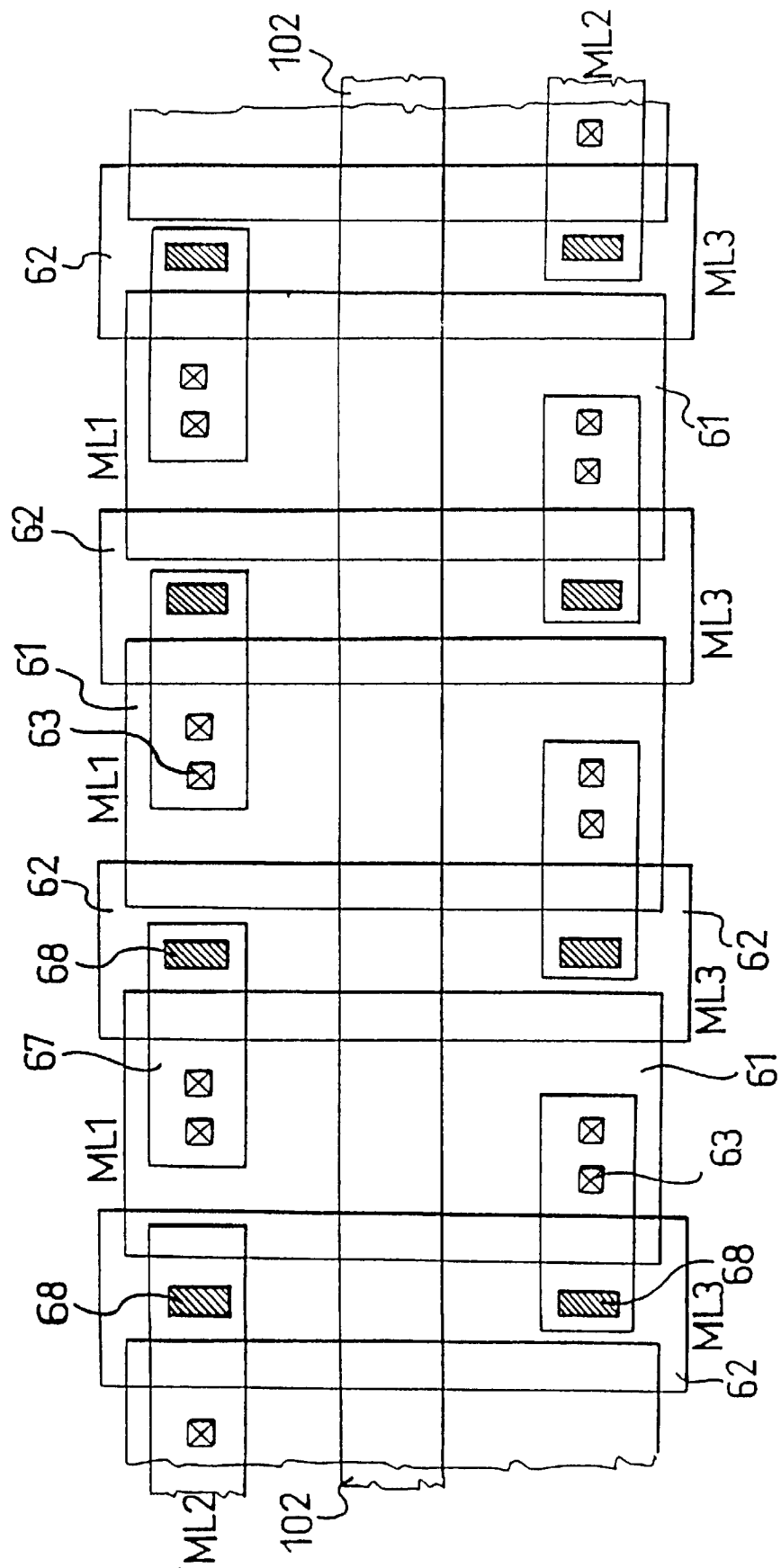
FIG. 17 is a plan view of a possible modified construction of some coil turns of an inductor according to the invention.

FIG. 16 shows how simple the construction of a transformer in accordance with the method of this invention can be, and how well the two or more windings are coupled when a closed magnetic core is provided. The figure brings out, additionally to the symbols previously described, the terminals 106 and 107 of two transformer windings for later connection to the terminals 105 of the integrated circuit. FIG. 17 shows a different embodiment of the coil turn of an inductor or transformer, wherein three interconnect levels are employed to reduce the resistivity of the elementary turn and, most importantly, to allow an increased thickness for the magnetic core 102 being sandwiched between the first and third interconnect levels.

The coil turns are formed by a set of parallel segments from two metallization layers having their ends connected by holes, in an otherwise conventional arrangement. The difference is given by the introduction of a metal core which concentrates the magnetic field lines within the solenoid, thereby enabling the inductance per unit area to be increased. This core is formed from an intermediate material layer between those forming the coil turns.

Figure 18:
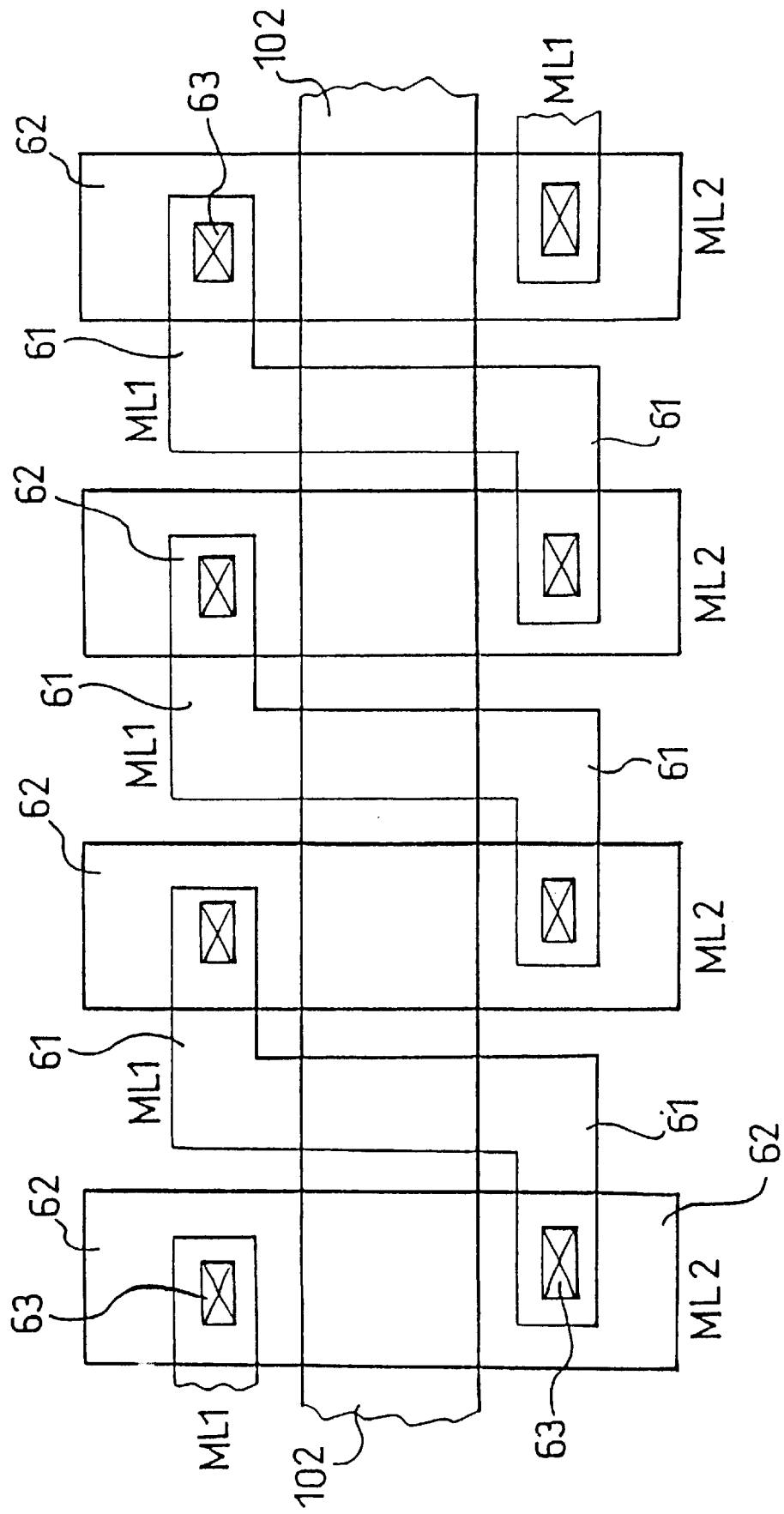
FIG. 18 is a plan view of some coil turns of the inductor in FIG. 15.
Figure 19:
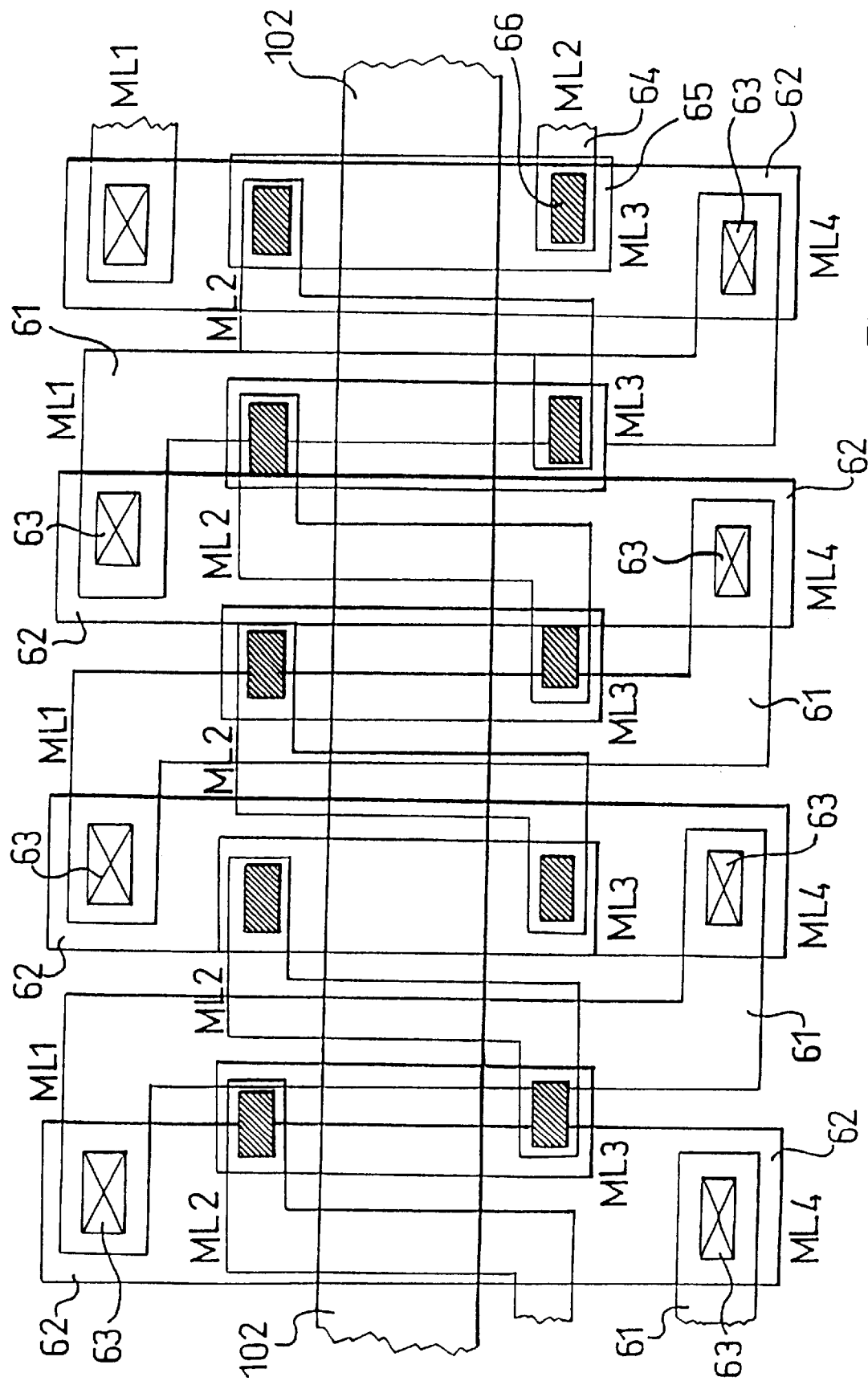
FIG. 19 is a plan view of some coil turns of two inductors coupled in a coaxial fashion.

FIG. 18 is a detail view of FIG. 15 illustrating the use of two interconnect levels only. FIG. 19 shows another embodiment requiring four interconnect levels to provide a coaxial coupling inductor, plus the closed core, and intended for applications where the inductance value is such that he surface area of the semiconductor substrate proves insufficient for the embodiment according to FIG. 16.

Figure 21:
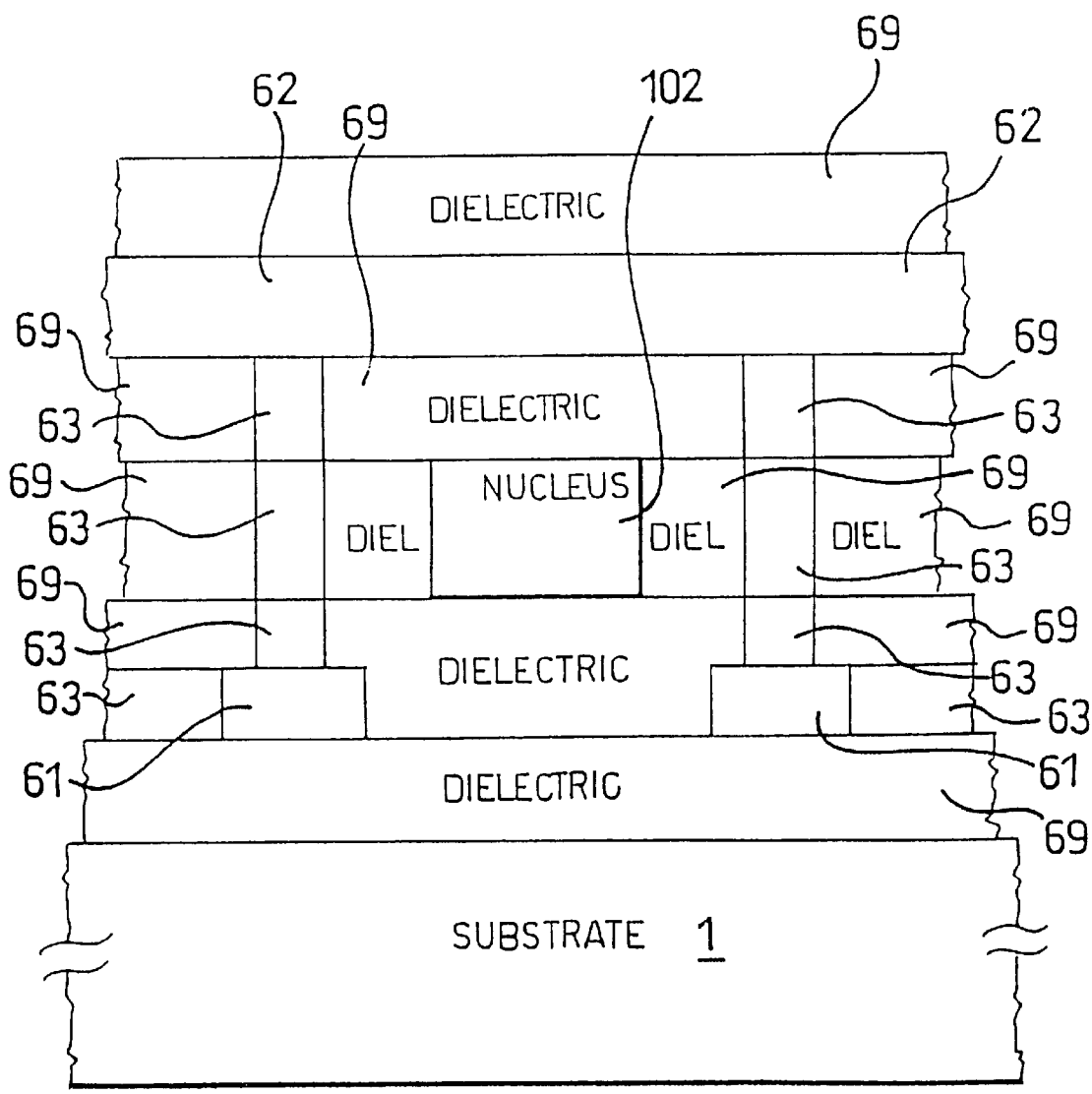
FIG. 21 is a sectional view showing schematically a coil turn constructed in accordance with the invention.

FIG. 21 is a sectional view of coil turns constructed from two interconnect levels as shown in FIG.18, for example. This can be viewed as a ross-section taken through the magnetic circuit, perpendicularly to the core 102, from a point contained in the vias 63. A dielectric 69 is formed on the substrate 1 in the area intended to contain the inductor coil turn. Formed over this, again by the same process steps used to form the interconnections in other areas of the device, is the lower portion of the coil turn utilizing the first interconnect level 61. A further dielectric layer 69 is formed with polyimide, for example, which is then patterned with the vertical conducting interconnections or vias 63 using the same techniques as for the portion which contains the integrated circuit.

A further dielectric layer 69 is formed over the first, and the structure of the core 102 and the vias 63 is defined thereon with conventional photolithographic techniques. The material forming the core 102 may also be used, if desired, to make the vias 63 conductive, depending on the material employed. A further dielectric layer 69 and vias 63 provide the basis for forming the second interconnect level 62. The next dielectric layer 69 completes the magnetic coil turn structure. The process steps for implementing the invention are already included in the standard process flow for forming integrated circuits on a semiconductor substrate, and require no significant changes except, of course, for the additional masking steps to form the magnetic core, where provided.

Considering the basic element of the magnetic circuit, namely the coil turn, this consists of two interconnect levels 61 and 62, usually of metal for low resistivity, and two vertical connections or vias 63 commonly used for connecting the two interconnect levels.

The invention provides for the formation, after forming the first interconnect layer 61 and patterning the vias 63, of an insulating material layer 69, e.g. made of a polyimide, to a thickness of a few microns. A magnetic material, e.g. ferronickel, is deposited over the latter, and will be used to produce the core 102 of the magnetic circuit according to the invention. Its size and thickness are set by the characteristics of the magnetic circuit to be formed, and can be obtained by applying well known laws of physics and magnetism. A suitable mask will be used to pattern the magnetic core structure in conformity with well-known photolithographic techniques.

A second layer 69 of an insulating material, e.g. polyimide, is then deposited, it smooths out any unevenness in the underlying magnetic material because of its known planarizing action. Vias 63 will be later patterned in this layer at the locations of the previous holes to connect the first interconnect layer 61 of the magnetic circuit to the second interconnect layer 62 of the magnetic circuit. For best quality of the magnetic component, it is desirable that the holes be of the so-called plugged types, i.e. filled with a chemically vapor-deposited (CVD) wetting conductive material, e.g. tungsten. This process step is commonly used in the manufacture of large-scale integrated circuits.

The two interconnect levels utilized in the magnetic circuit may be any two interconnect levels available in the integrated circuit manufacturing process, although it is preferable to use the first and the last ones to reduce the parasitic capacitance of the winding and increase the thickness of the magnetic core, where provided.

Such choice is only dictated by their characteristics in view of the magnetic component to be made, being it known to those skilled in the art that the different interconnect levels have different thicknesses and, therefore, different electric characteristics. The simplicity of the process for forming a magnetic component on a semiconductor substrate and its consistency with current technologies for fabricating integrated circuits, even large-scale and submicron ones, will be appreciated from the foregoing.

It can also be seen, in FIGS. 15 and 16, that the component has a closed geometry, this being a vital expedient if the magnetic field lines are to be prevented from exiting the solenoid and inducing stray currents in the substrate. For simplicity, an inductor of rectangular shape has been shown in FIGS. 15 and 16, but toroidal shape inductors could be provided instead.

FIG. 16 shows a transformer with two windings. Compared to FIG. 15, it is sufficient to arrange for the turns to be broken at two points. It will be appreciated that transformers with any number of windings could be easily formed by the same method. As a result, a range of voltage values can be generated from a single AC source.

Besides inductance, the parasitic series resistance (and hence, the quality factor Q) depends upon the inductor layout. Account should be taken of the layout and thickness rules for each metallization layer; in general, both the minimum dimensions (width and spacing) and thickness increase from the first to the last level. The second metallization level may be utilized not only for the solenoid core, but also to reduce the parasitic resistance associated with each via, to avoid direct interconnections between the first and the third metallization level, and eventually to allow a less stringent device layout.

FIG. 17 shows a further embodiment which takes account of the considerations made hereinabove, and is directed to reduce the parasitic series resistance of the inductor without lowering its inductance per unit area. In the figure, which shows an inductor according to the invention, it can be seen that the third metallization layer determines the number of turns per unit length and that, in order to reduce the resistance of each turn, the width of the paths formed by the first metallization level has been increased. Once again, the holes are defined in the second intermediate metallization layer, never between the first and third layers.

A further modification of the invention provides for the two interconnect layers and the core layer to be coincident with those from a current process featuring three interconnect levels. The second layer can be formed by a ferromagnetic material to further enhance the inductance values per unit of occupied area. It would also be possible to use silicide or polycide layers for the formation of the first interconnect layer.

We claim:

1. An integrated circuit comprising:

a substrate;

one or more semiconductor components on said substrate;

a first electrically conductive layer on said substrate;

a first insulating layer on said first electrically conductive layer;

a layer of magnetic material on said first insulating layer and defining a closed-loop magnetic component positioned laterally adjacent said one or more semiconductor components;

a second insulating layer on said closed-loop magnetic component;

a second electrically conductive layer on said second insulating layer; and a first plurality of vertical electrical conductors connecting portions of said first and said second electrically conductive layers to define a first three-dimensional helical conductive structure surrounding at least a portion of said closed loop magnetic component laterally adjacent said one or more semiconductor components;

at least one of said first and second electrically conductive layers also connecting the one or more semiconductor components.

2. An integrated circuit according to claim 1 further comprising a second plurality of vertical conductors connecting portions of said first and second electrically conductive layers to define a second helical structure surrounding at least a portion of said closed-loop magnetic component.

3. An integrated circuit according to claim 2 wherein said first and second helical structures define a transformer in cooperation with said closed-loop magnetic component.

4. An integrated circuit according to claim 1, further comprising at least one other electrically conductive layer; and wherein said first electrically conductive layer is a lowermost electrically conductive layer, and said second electrically conductive layer is an uppermost electrically conductive layer.

5. An integrated circuit according to claim 1, wherein the magnetic material has a magnetic permeability of higher than about one.

6. An integrated circuit according to claim 1, wherein the magnetic material comprises a ferronickel alloy.

7. An integrated circuit according to claim 1, wherein the magnetic material comprises an aluminum-based alloy.

8. An integrated circuit comprising:

a substrate;

one or more semiconductor components on said substrate;

a first electrically conductive layer on said substrate;

a first insulating layer on said first electrically conductive layer;

a layer of magnetic material on said first insulating layer and defining a closed-loop magnetic component positioned laterally adjacent said one or more semiconductor components;

a second insulating layer on said closed-loop magnetic component;

a second electrically conductive layer on said second insulating layer;

a first plurality of vertical electrical conductors connecting portions of said first and said second electrically conductive layers to define a first three-dimensional helical conductive structure surrounding a portion of said closed-loop magnetic component laterally adjacent said one or more semiconductor components; and a second plurality of vertical conductors connecting portions of said first and second electrically conductive layers to define a second three-dimensional helical conductive structure surrounding a portion of said closed-loop magnetic component so that said first and second helical conductive structures define a transformer in cooperation with said closed-loop magnetic component laterally adjacent said one or more semiconductor components;

at least one of said first and second electrically conductive layers also connecting the one or more semiconductor components.

9. An integrated circuit according to claim 8, further comprising at least one other electrically conductive layer; and wherein said first electrically conductive layer is a lowermost electrically conductive layer, and said second electrically conductive layer is an uppermost electrically conductive layer.

10. An integrated circuit according to claim 8, wherein the magnetic material has a magnetic permeability of higher than about one.

11. An integrated circuit according to claim 8, wherein the magnetic material comprises a ferronickel alloy.

12. An integrated circuit according to claim 8, wherein the magnetic material comprises an aluminum-based alloy.

13. An integrated circuit comprising:

a substrate;

one or more semiconductor components on said substrate;

a first electrically conductive layer on said substrate being a lowermost electrically conductive layer;

a first insulating layer on said first electrically conductive layer;

a second electrically conductive layer on said first insulating layer being an uppermost electrically conductive layer;

at least one other electrically conductive layer;

a first plurality of vertical electrical conductors connecting portions of said first and said second electrically conductive layers to define a first three-dimensional helical conductive structure defining an inductor positioned laterally adjacent said one or more semiconductor components; and at least one of said first and second electrically conductive layers also connecting the one or more semiconductor components.

14. An integrated circuit comprising:

a substrate;

one or more semiconductor components on said substrate;

a first electrically conductive layer on said substrate;

a first insulating layer on said first electrically conductive layer;

a layer of magnetic material on said first insulating layer and defining a first magnetic component;

a second insulating layer on said magnetic component;

a second electrically conductive layer on said second insulating layer;

a first plurality of vertical electrical conductors connecting portions of said first and said second electrically conductive layers to define a first helical structure surrounding at least a portion of said first magnetic component; and at least one other electrically conductive layer;

at least one of said first and second electrically conductive layers also connecting the one or more semiconductor components, said first electrically conductive layer being a lowermost electrically conductive layer and said second electrically conductive layer being an uppermost electrically conductive layer.

15. An integrated circuit according to claim 14, wherein said first magnetic component has a closed-loop configuration.

16. An integrated circuit according to claim 14, wherein said magnetic layer defines a second magnetic component, and further comprising a second plurality of vertical conductors connecting portions of said first and second electrically conductive layers to define a second helical structure surrounding at least a portion of said second magnetic component.

17. An integrated circuit according to claim 16, wherein said magnetic layer also comprises connecting means for magnetically connecting said first and second magnetic components.

18. An integrated circuit according to claim 17, wherein said connecting means and said first and second magnetic components define a closed-loop configuration so that said first and second helical structures define a transformer in cooperation with said connecting means and said first and second magnetic components.

19. An integrated circuit according to claim 14, wherein the magnetic material has a magnetic permeability of higher than about one.

20. An integrated circuit according to claim 14, wherein the magnetic material comprises a ferronickel alloy.

21. An integrated circuit according to claim 14, wherein the magnetic material comprises an aluminum-based alloy.

* * * * *